(12) United States Patent
Boers et al.

(10) Patent No.: US 10,158,508 B1
(45) Date of Patent: Dec. 18, 2018

(54) METHODS, SYSTEMS, AND APPARATUS FOR PHASE-SHIFTED SIGNAL GENERATION

(71) Applicant: Avago Technologies International Sales Pte. Limited, Singapore (SG)

(72) Inventors: Michael Boers, Turramurra (AU); Wei Liat Chan, Irvine, CA (US); Tirdad Sowlati, Irvine, CA (US); Bevin Perumana, Riverside, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/216,522

(22) Filed: Jul. 21, 2016

Related U.S. Application Data

(60) Provisional application No. 62/326,631, filed on Apr. 22, 2016.

(51) Int. Cl.
*H04L 27/20* (2006.01)
*H04L 27/34* (2006.01)
*H04B 7/06* (2006.01)

(52) U.S. Cl.
CPC ......... *H04L 27/206* (2013.01); *H04B 7/0613* (2013.01); *H04L 27/34* (2013.01)

(58) Field of Classification Search
CPC .......... H03C 1/08; H03C 3/10; H03D 1/2209; H03D 1/2245; H03D 3/007; H03D 3/009; H04B 3/03; H04B 3/16; H04B 7/0456; H04B 7/0613; H04L 27/04; H04L 27/06; H04L 27/2053; H04L 27/206; H04L 27/2085; H04L 27/2089; H04L 27/2273; H04L 27/34; H04L 27/362; H04L 27/389

USPC ....... 375/257, 258, 279–281, 283, 298, 308, 375/329–332; 329/304, 345, 347, 348; 332/103, 144, 149, 151
See application file for complete search history.

(56) References Cited

U.S. PATENT DOCUMENTS

| | | | | |
|---|---|---|---|---|
| 4,499,471 A | * | 2/1985 | Luh | ........................ H01Q 19/17 333/109 |
| 2011/0255575 A1 | * | 10/2011 | Zhu | ...................... H04B 1/0475 375/219 |
| 2012/0155573 A1 | * | 6/2012 | Pruvost | .................. H03H 11/22 375/302 |
| 2013/0070868 A1 | * | 3/2013 | Yang | ..................... H04L 27/364 375/295 |

\* cited by examiner

*Primary Examiner* — Young T Tse
(74) *Attorney, Agent, or Firm* — Sterne, Kessler, Goldstein & Fox P.L.L.C.

(57) ABSTRACT

Methods, systems, and apparatuses are described for generating a phase-shifted signal in a transmit path and a receive path of a transceiver. When transmitting, a quadrature hybrid in the transmit path generates at least one in-phase signal and at least one quadrature signal based on a modulated signal. Phase shifters generate phase-shifted versions of the modulated signal based on a combination of these signals. When receiving, antennas receive a modulated signal and provide the modulated signal to phase shifters in the receive path. Each phase shifter modifies its received modulated signal. A matching network combines each of the modified modulated signals and provides at least one combined modulated signal to a quadrature hybrid. The quadrature hybrid generates a phase-shifted version of the modulated signal based on the at least one combined signal.

7 Claims, 10 Drawing Sheets

METHODS, SYSTEMS, AND APPARATUS FOR PHASE-SHIFTED SIGNAL GENERATION

CROSS-REFERENCE TO RELATED APPLICATIONS

This application claims priority to U.S. Provisional Patent Application No. 62/326,631, filed Apr. 22, 2016, the entirety of which is incorporated by reference herein.

BACKGROUND

Technical Field

The subject matter described herein relates to communication systems, and in particular, to techniques for phase-shifted signal generation for a phased array of antennas.

Background Art

A phased array of antennas uses multiple radiating elements to transmit, receive, or transmit and receive radio frequency (RF) signals. One well known type of a phased array of antennas is an electronically steerable phased array of antennas. The electronically steerable phased array of antennas has full electronic steering capability, is more compact, and has a smaller profile than a comparable mechanical phased array of antennas. However, an electronically steerable phased array of antennas require the integration of many RF electronic components, which increase the cost, size, and complexity of its architecture. For example, prior designs using a Cartesian phase shift topology often require a quadrature generation network for each radiating element, thus resulting in a design that fills a large area.

BRIEF SUMMARY

Methods, systems, and apparatuses are described for phase-shifted signal generation, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

Figure 1:
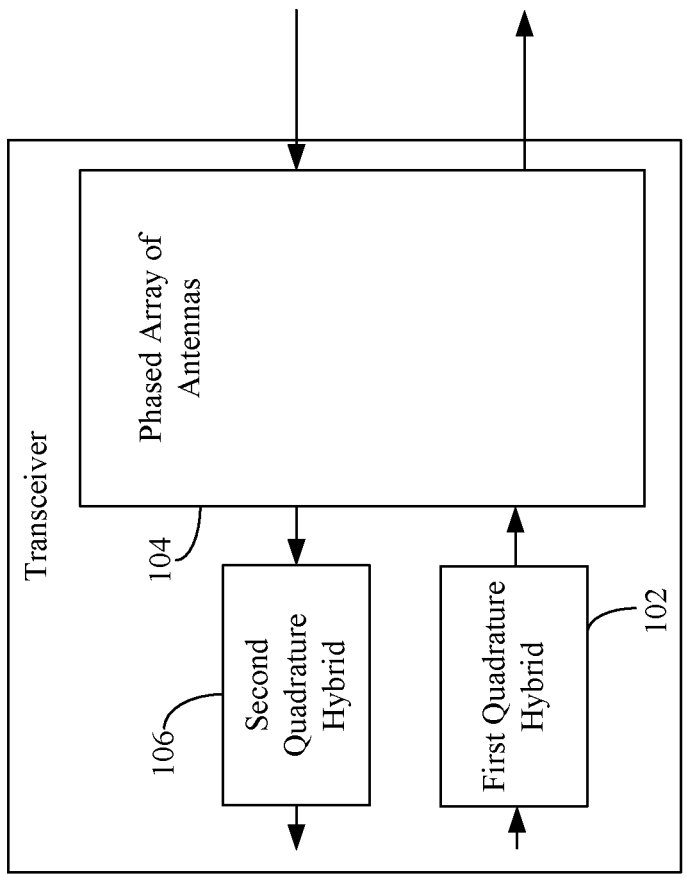
FIG. 1 depicts a block diagram of a transceiver in accordance with an embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Numerous exemplary embodiments are described as follows. It is noted that any section/subsection headings provided herein are not intended to be limiting. Embodiments are described throughout this document, and any type of embodiment may be included under any section/subsection. Furthermore, disclosed embodiments may be combined with each other in any manner.

In embodiments, a transceiver is described herein that includes a transmit path and a receive path. When transmitting, quadrature hybrid in the transmit path generates at least one in-phase signal and at least one quadrature signal based on a modulated signal. Phase shifters in the transit path each receive the at least one in-phase signal and the at least one quadrature signal and generate phase-shifted versions of the modulated signal based on a combination of the at least one in-phase signal and the at least one quadrature signal. The at least one in-phase signal and the at least one quadrature signal generated by the quadrature hybrid are shared with each of the phase shifters, thereby resulting in a smaller routing network and smaller area.

When receiving, a plurality of antennas receive a modulated signal, and the modulated signal is received from the antennas by a plurality of phase shifters in the receive path. Each phase shifter modifies its received modulated signal (e.g., reduces its amplitude). A matching network combines each of the modified modulated signals received from each of the phase shifters and generates at least one combined modulated signal that is/are received by quadrature hybrid. The quadrature hybrid generates a phase-shifted version of the modulated signal based on the at least one combined signal. The matching network and quadrature hybrid are shared by each of the phase shifters, thereby resulting in a smaller routing network and smaller area.

In particular, a method described herein. In accordance with the method, at least one in-phase signal and at least one quadrature signal is generated by quadrature hybrid, wherein the at least one in-phase signal and the at least one quadrature signal are based on a modulated signal. At least a first phase-shifted version of the modulated signal is generated by a first of the plurality of phase shifters based on a first combination of one or more of the at least one in-phase signal and the at least one quadrature signal. At least a second phase-shifted version of the modulated signal is generated by a second of the plurality of phase shifters based on a second combination of one or more of the at least one in-phase signal and the at least one quadrature signal.

Another method is described herein. In accordance with the method, a modulated signal is received by a plurality of antennas, and is then received by a plurality of phase shifters from the antennas. The modulated signal is modified by each phase shifter of the plurality of phase shifters to generate a modified modulated signal, and each of the modified modulated signals are received by a matching network. The modified modulated signals received from the plurality of phase shifters are combined by the matching network to generate at least one combined signal. A phase-shifted version of the modulated signal is generated by quadrature hybrid based on the at least one combined signal.

A transmitter is further described herein. The transmitter includes quadrature hybrid configured to receive a modulated signal and generate at least one in-phase signal and at least one quadrature signal based on the modulated signal. The transmitter also includes a plurality of phase shifters, wherein each of the plurality of phase shifters is configured to receive the at least one in-phase signal and the at least one quadrature signal, and generate a phase-shifted version of the modulated signal based on a combination of one or more of the at least one in-phase signal and the at least one quadrature signal.

Example Embodiments

FIG. 1 depicts a high-level block diagram of a transceiver 100 in accordance with an embodiment. As shown in FIG. 1, transceiver 100 includes a first quadrature hybrid 102, a phased array of antennas 104, and a second quadrature hybrid 106.

When transmitting, first quadrature hybrid 102 is configured to receive a modulated signal and output at least one in-phase signal and at least one quadrature signal (i.e., a signal that has a 90 degree offset with respect to the at least one in-phase signal) based on the modulated signal. The at least one in-phase signal and the at least one quadrature signal are received by phased array of antennas 104. Each antenna of phased array of antennas 104 is configured to transmit the modulated signal at a corresponding, certain phase (e.g., 0 degrees, 45 degrees, 90 degrees, etc.) such that the effective radiation pattern of phased array of antennas 104 is reinforced in a desired direction and suppressed in undesired directions. The direction of the reinforced radiation pattern, also referred to as a beam, may be changed (or steered) depending on the phase at which each antenna of phased array of antennas 104 transmits the modulated signal. The phase at which each antenna of phased array of antennas 104 transmits the modulated signal is based on the at least one in phase signal, the at least one quadrature signal, and/or a combination thereof.

When receiving, phased array of antennas 104 is configured to receive a modulated signal from a desired direction. The modulated signal is received by each antenna of phased array of antennas 104. Each of these modulated signals may be amplitude adjusted to generate a first amplitude-adjusted modulated signal and/or a second amplitude adjusted signal. Each of the first amplitude-adjusted modulated signals may be combined in phase, and each of the second amplitude-adjusted modulated signals may be combined in phase. The combined, first amplitude-adjusted modulated signals and/or the combined, second amplitude adjusted modulated signals is/are received by second quadrature hybrid 106. Second quadrature hybrid 106 is configured to generate a quadrature version of the combined, second amplitude-adjusted modulated signals. Second quadrature hybrid 106 is configured to combine the combined, first amplitude-adjusted modulated signals and the quadrature version thereof to output a phase-shifted modulated signal (i.e., a version of the modulated signal received by phased array of antennas 104 that has been phase-shifted).

Transmitter 100 may be included in devices such as, but not limited to, a router, wireless access point, RADAR devices, cellular and smart phones, computers, and/or any device in which multiple antennas are used for transmitting and/or receiving modulated signals.

Subsection A describes embodiments that are used to generate a phase-shifted modulated signal in a transmit path of a transceiver 100. Subsection B describes embodiments that are used to generate a phase-shifted modulated signal in a receive path of a transceiver 100. It is noted that while the embodiments described herein are described with reference to a transceiver, such embodiments may be implemented in separate devices, such as a transmitter or a receiver.

A. Phase-Shifted Modulated Signal Generation in a Transmit Path

Figure 2:
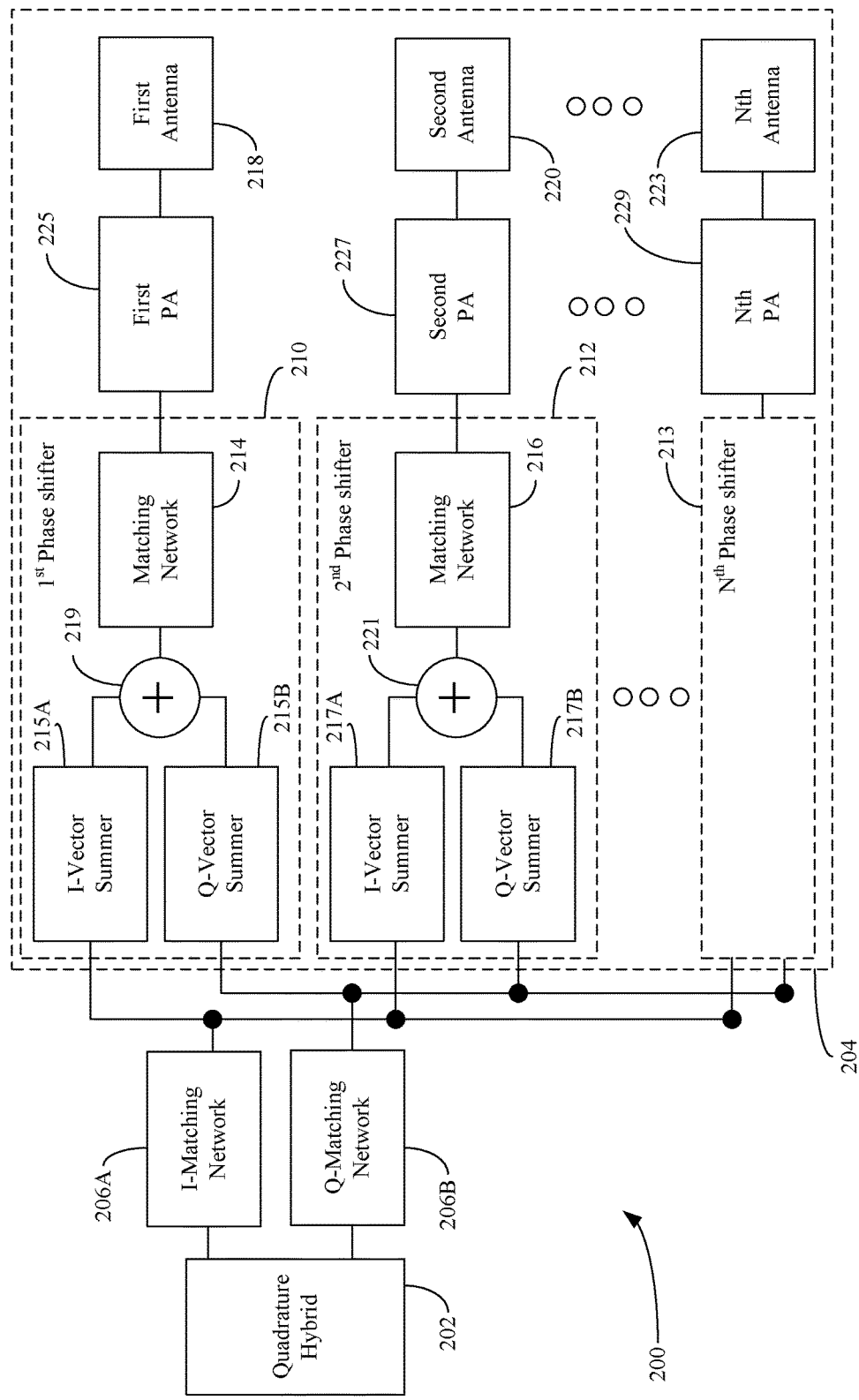
FIG. 2 depicts diagram of a transmit path of a transceiver in accordance with an embodiment.

FIG. 2 depicts diagram of a transmit path 200 of a transceiver (e.g., transceiver 100, as shown in FIG. 1) in accordance with an embodiment. As shown in FIG. 2, transmit path 200 includes a quadrature hybrid 202, an I-matching network 206A, a Q-matching network 206B, and a phased array of antennas 204. Quadrature hybrid 202 is an example of first quadrature hybrid 102, as shown in FIG. 1, and phased array of antennas 204 is an example of phased array of antennas 104, as shown in FIG. 1.

Phased array of antennas 204 includes a first phase shifter 210, a second phase shifter 212, an Nth phase shifter 213, a first power amplifier 225, a second power amplifier 227, an Nth power amplifier 229, a first antenna 218, a second antenna 220, and an Nth antenna 223, where is N is any positive integer.

Quadrature hybrid 202 is configured to receive a modulated signal and output at least one in-phase signal and at least one quadrature signal based on the modulated signal. In accordance with an embodiment, quadrature hybrid 202 outputs a differential pair of in-phase signals and a differential pair of quadrature signals. In accordance with another embodiment, quadrature hybrid 202 outputs a single-ended in-phase signal and a single-ended quadrature signal. In accordance with an embodiment, quadrature hybrid 202 is a passive quadrature generator.

I-matching network 206A is configured to provide a conjugate match for the output impedance of at least one port of quadrature hybrid 202 (which provides the at least one in-phase signal) and the input impedance of first phase shifter 210, second phase shifter 212, and Nth phase shifter 213 to minimize power loss.

Q-matching network 206B is configured to provide a conjugate match for the output impedance of at least one port of quadrature hybrid 202 (which provides the at least one quadrature signal) and the input impedance of first phase shifter 210, second phase shifter 212, and Nth phase shifter 213 to minimize power loss.

First phase shifter 210 includes an I-vector summer 215A, a Q-vector summer 215B, a combiner 219 and a matching network 214. First phase shifter 210 is configured to receive the at least one in-phase signal and the at least one quadrature signal and output a first phase-shifted modulated signal. For example, I-vector summer 215A receives the at least one in-phase signal from I-matching network 206A, and Q-vector summer 215B receives the at least one quadrature signal from Q-matching network 206B. I-vector summer 215A selectively combines the at least one in-phase signal and provides the combined at least one in-phase signal to combiner 219. Q-vector summer 215B selectively combines the at least one quadrature signal and provides the combined at least one quadrature signal to combiner 219. Combiner 219 selectively combines one or more of the combined at least one in-phase signal and the combined at least one quadrature signal to obtain the first phase-shifted modulated signal. In accordance with an embodiment, first phase shifter 210 applies a scaling factor such that the amplitude of the combined at least one in-phase signal and the at least one quadrature signal is equal to the amplitude of the modulated signal received by quadrature hybrid 202. The first phase-shifted modulated signal is received by matching network 214.

Matching network 214 is configured to provide a conjugate match for the output impedance of first phase shifter 210 and the input impedance of first power amplifier 225 and/or first antenna 218 to minimize power loss.

First power amplifier 225 is configured to amplify the first phase-shifted modulated signal and provide the amplified, first phase-shifted modulated signal to first antenna 218.

First antenna 218 is configured to wirelessly transmit the amplified, first phase-shifted modulated signal.

Second phase shifter 212 includes an I-vector summer 217A, a Q-vector summer 217B, a combiner 221 and a matching network 216. Second phase shifter 212 is configured to receive the at least one in-phase signal and the at least one quadrature signal and output a second phase-shifted modulated signal. For example, I-vector summer 217A receives the at least one in-phase signal from I-matching network 206A, and Q-vector summer 217B receives the at least one quadrature signal from Q-matching network 206B. I-vector summer 217A selectively combines the at least one in-phase signal and provides the combined at least one in-phase signal to combiner 221. Q-vector summer 217B selectively combines the at least one quadrature signal and provides the combined at least one quadrature signal to combiner 221. Combiner 221 selectively combines one or more of the combined at least one in-phase signal and the combined at least one quadrature signal to obtain the second phase-shifted modulated signal. In accordance with an embodiment, second phase shifter 212 applies a scaling factor such that the amplitude of the combined at least one in-phase signal and the at least one quadrature signal is equal to the amplitude of the modulated signal received by quadrature hybrid 202. The second phase-shifted modulated signal is received by matching network 216.

Matching network 216 is configured to provide a conjugate match for the output impedance of second phase shifter 212 and the input impedance of power amplifier 227 and/or second antenna 220 to minimize power loss.

Second power amplifier 227 is configured to amplify the second phase-shifted modulated signal and provide the amplified, second phase-shifted modulated signal to second antenna 220.

Second antenna 220 is configured to wirelessly transmit the amplified, second phase-shifted modulated signal.

Nth phase shifter 213 is configured to receive the at least one in-phase signal and the at least one quadrature signal and output an Nth phase-shifted modulated signal. Nth phase shifter 213 is configured to operate in a similar manner as first phase shifter 210 and second phase shifter 212. Accordingly, Nth phase shifter 213 may also include an I-vector summer, Q-vector summer, a combiner and a matching network. However, these components are not shown nor are described for sake of brevity. The Nth phase-shifted modulated signal is provided to Nth power amplifier 229.

Nth power amplifier 229 is configured to amplify the Nth phase-shifted modulated signal and provide the amplified, Nth phase-shifted modulated signal to Nth antenna 223.

Nth antenna 223 is configured to wirelessly transmit the amplified, Nth phase-shifted modulated signal.

As shown in FIG. 2, a single quadrature hybrid (i.e., quadrature hybrid 202) is used for an N number of phase shifter (i.e., first phase shifter 210, second phase shifter 212, and Nth phase shifter 213) rather than a single quadrature hybrid for each phase shifter.

Figure 3:
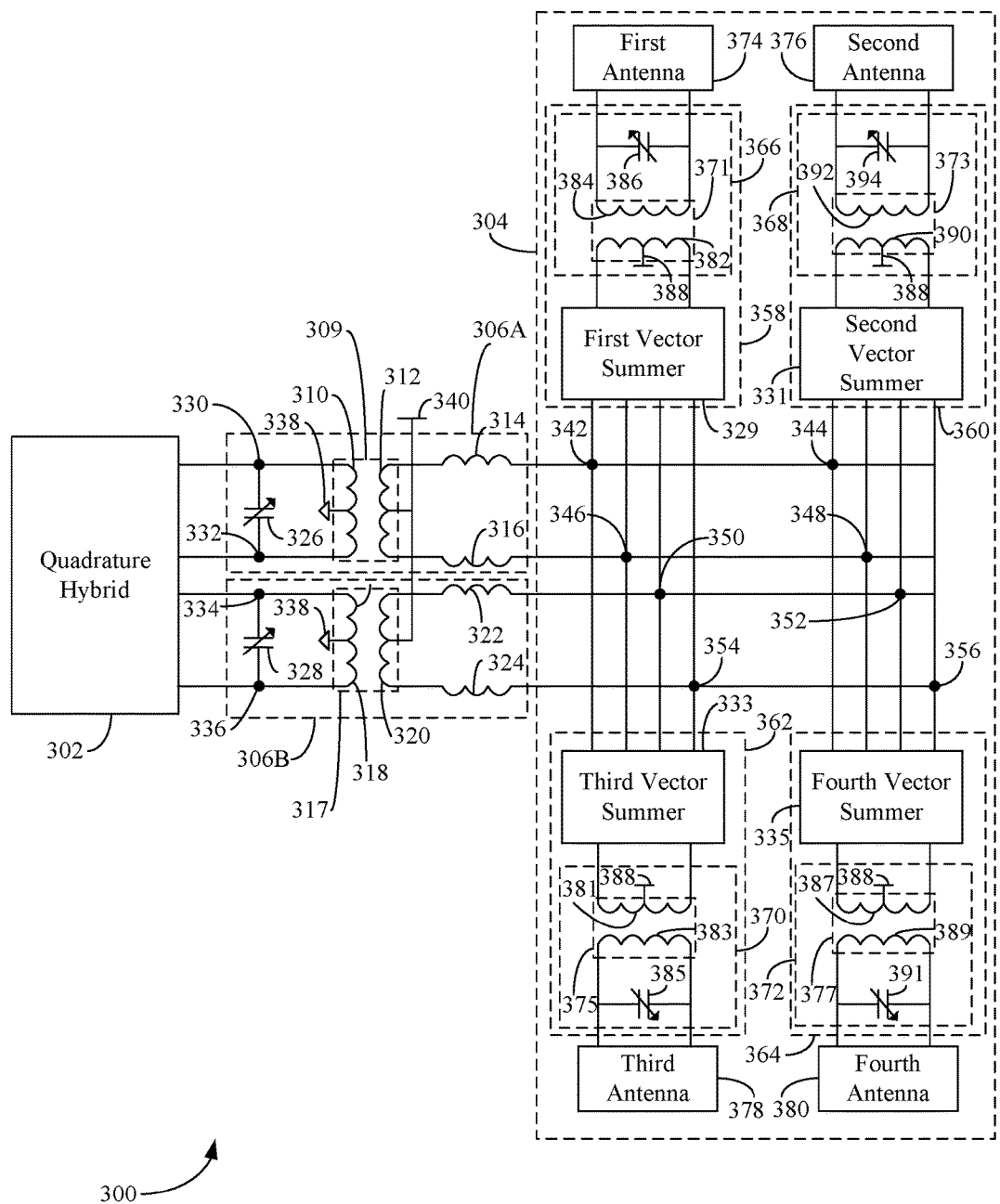
FIG. 3 depicts diagram of a transmit path of a transceiver in which a differential pair of in-phase signals and a differential pair of quadrature signals are provided to a plurality of phase shifters in accordance with an embodiment

FIG. 3 depicts diagram of a transmit path 300 of a transceiver in which a differential pair of in-phase signals and a differential pair of quadrature signals are received by a plurality of phase shifters in accordance with an embodiment. Transmit path 300 is an example of transmit path 200, as shown in FIG. 2 As shown in FIG. 3, transmit path 300 includes quadrature hybrid 302, an I-matching network 306A, a Q-matching network 306B, and a phased array of antennas 304. Quadrature hybrid 302 is an example of first quadrature hybrid 202, as shown in FIG. 2, I-matching network 306A is an example of I-matching network 206A, Q-matching network 306B is an example of Q-matching network 206B, as shown in FIG. 2, and phased array of antennas 304 is an example of phased array of antennas 204, as shown in FIG. 2.

Phased array of antennas 304 includes at least a first phase shifter 358, a second phase shifter 360, a third phase shifter 362, a fourth phase shifter 364, a first antenna 374, a second antenna 376, a third antenna, 378, and a fourth antenna 380. It is noted that one or more components (e.g., power amplifier(s)) are not shown for sake of brevity. Each of first phase shifter 358, second phase shifter 360, third phase shifter 362, and fourth phase shifter 364 may be an example of first phase shifter 210, second phase shifter 212, or Nth phase shifter 213, as shown in FIG. 2. First phase shifter 358 includes a first vector summer 329 and a matching network 366, second phase shifter 360 includes a second vector summer 331 and a matching network 368, third phase shifter 362 includes a third vector summer 333 and a matching network 370, and fourth phase shifter 364 includes a fourth vector summer 335 and a matching network 372. Each of first vector summer 329, second vector summer 331, third vector summer 333, and fourth vector summer 335 may be a collective representation of I-vector summer 215A, Q-vector summer 215B and combiner 219 or I-vector summer 217A, Q-vector summer 217B and combiner 221, as shown in FIG. 2. Each of matching network 366, matching network 368, matching network 370, and matching network 372 may be an example of matching network 214 or matching network 216, as shown in FIG. 2. Each of first antenna 374, second antenna 376, third antenna 378, and fourth antenna 380 may be an example of first antenna 218, second antenna 220, or Nth antenna 223, as shown in FIG. 2. It is noted that while FIG. 2 shows phased array of antennas 304 as including four phase shifters (i.e. first phase shifter 358, second phase shifter 360, third phase shifter 362, and fourth phase shifter 364) and four antennas (first antenna 374, second antenna 376, third antenna 378, and fourth antenna 380), phased array of antennas 304 may include any number of phase shifters, matching networks and antennas.

Quadrature hybrid 302 is configured to receive a modulated signal and output a differential pair of in-phase signals and a differential pair of quadrature signals based on the modulated signal. A first signal of the differential pair of in-phase signals may have a first polarity, and the second signal of the differential pair of in-phase signals may have a second polarity that is opposite to the first polarity. That is, the first signal of the differential pair of in-phase signals is a complement of the second signal of the differential pair of in-phase signals. A first signal of the differential pair of quadrature signals may have a first polarity, and the second signal of the differential pair of quadrature signals may have a second polarity that is opposite to the first polarity. That is, the first signal of the differential pair of quadrature signals is a complement of the second signal of the differential pair of quadrature signals. The first signal of the differential pair of in-phase signals may represent the modulated signal phase-shifted by 0 degrees, the second signal of the differential pair of in-phase signals may represent the modulated signal phase-shifted by 180 degrees, the first signal of the differential pair of quadrature signals may represent the modulated signal phase-shifted by 90 degrees, and the second signal of the differential pair of quadrature signals may represent the modulated signal phase-shifted by 270 degrees. Quadrature hybrid 302 may be implemented using a combination of one or more of a processor (e.g., processor 1000, as described with reference to FIG. 10), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

I-matching network 306A is coupled to quadrature hybrid 302 via a node 330, a node 332, a node 334, and a node 336. I-matching network 306A includes a first transformer 309 (which includes a first inductor 310 and a second inductor 312), a third inductor 314, a fourth inductor 316, a second transformer 317 (which includes a fifth inductor 318 and a sixth inductor 320), a seventh inductor 322, an eighth inductor 324, a first variable capacitor 326, and a second variable capacitor 328. First inductor 310 is coupled to node 330 and node 332 and has a center tap coupled to a ground 338. Second inductor 312 is coupled to third inductor 314 and fourth inductor 316 and has a center tap coupled to a power source 340. Third inductor 314 is coupled to second inductor 312, a node 342, and a node 344. Fourth inductor 316 is coupled to second inductor 312, a node 346, and a node 348. Variable capacitor 326 is coupled between node 330 and 332. Fifth inductor 318 is coupled to node 334 and node 336 and has a center tap coupled to ground 338. Sixth inductor 320 is coupled to seventh inductor 322 and eighth inductor 324 and has a center tap coupled to power source 340. Seventh inductor 322 is coupled to sixth inductor 320, a node 350, and a node 352. Eight inductor 324 is coupled to seventh inductor 320, a node 354, and a node 356. Variable capacitor 328 is coupled between node 334 and 336. Nodes 342, 344, 346, 348, 350, 352, 354, and 356 couple matching network 308 to first phase shifter 358, second phase shifter 360, third phase shifter 362, and fourth phase shifter 364.

I-matching network 306A receives the first signal of the differential pair of in-phase signals via node 330 and receives the second signal of the differential pair of in-phase signals via node 332. First inductor 310, second inductor 312, third inductor 314, fourth inductor 316 and variable capacitor 326 are collectively configured to provide a conjugate match for the output impedance of the ports of quadrature hybrid 302 that provide the differential pair of in-phase signals and the input impedance of first phase shifter 358, second phase shifter 360, third phase shifter 362, and fourth phase shifter 364 to minimize power loss.

I-matching network 306A further receives the first signal of the differential pair of quadrature signals via node 334 and receives the second signal of the differential pair of quadrature signals via node 336. Fifth inductor 318, sixth inductor 320, seventh inductor 322, eight inductor 324 and variable capacitor 328 are collectively configured to provide a conjugate match for the output impedance of the ports of quadrature hybrid 302 that provide the differential pair of quadrature signals and the input impedance of first phase shifter 358, second phase shifter 360, third phase shifter 362, and fourth phase shifter 364 to minimize power loss.

First phase shifter 358 is configured to receive the differential pair of in-phase signals and the differential pair of quadrature signals and output a first phase-shifted modulated signal. For example, first vector summer 329 may selectively combine one or more of the first signal of the differential pair of in-phase signals, the second signal of the differential pair of in-phase signals, the first signal of the differential pair of quadrature signals, and the second signal of the differential pair of quadrature signals to generate a first phase-shifted version of the modulated signal. In accordance with an embodiment, first vector summer 329 applies a scaling factor such that the amplitude of the combined one or more of the first signal of the differential pair of in-phase signals, the second signal of the differential pair of in-phase signals, the first signal of the differential pair of quadrature signals, and the second signal of the differential pair of quadrature signals is equal to the amplitude of the modulated signal received by quadrature hybrid 302. The first phase-shifted modulated signal is received by matching network 366.

Matching network 366 includes a third transformer 371 (which includes ninth inductor 382 and a tenth inductor 384) and a variable capacitor 386. Ninth inductor 382 has a center tap coupled to a power source 388. Ninth inductor 382, tenth inductor 384, and variable capacitor 386 are collectively configured to provide a conjugate match for the output impedance of the port(s) of first vector summer 329 that provide the first phase-shifted modulated signal and the input impedance of first antenna 374 (and/or a power amplifier coupled thereto) to minimize power loss.

First antenna 374 is configured to wirelessly transmit the first phase-shifted modulated signal to another device.

Second phase shifter 360 is configured to receive the differential pair of in-phase signals and the differential pair of quadrature signals and output a second phase-shifted modulated signal. For example, second vector summer 331 may selectively combine one or more of the first signal of the differential pair of in-phase signals, the second signal of the differential pair of in-phase signals, the first signal of the differential pair of quadrature signals, and the second signal of the differential pair of quadrature signals to generate a second phase-shifted version of the modulated signal. In accordance with an embodiment, second vector summer 331 applies a scaling factor such that the amplitude of the combined one or more of the first signal of the differential pair of in-phase signals, the second signal of the differential pair of in-phase signals, the first signal of the differential pair of quadrature signals, and the second signal of the differential pair of quadrature signals is equal to the amplitude of the modulated signal received by quadrature hybrid 302. The second phase-shifted modulated signal is received by matching network 368.

Matching network 368 includes a fourth transformer 373 (which includes an eleventh inductor 390 and a twelfth inductor 392) and a variable capacitor 394. Eleventh inductor 390 has a center tap coupled to a power source 388. Eleventh inductor 390, twelfth inductor 392, and variable capacitor 394 are collectively configured to provide a conjugate match for the output impedance of the port(s) of second vector summer 331 that provide the second phase-shifted modulated signal and the input impedance of second antenna 376 to minimize power loss.

Second antenna 376 is configured to wirelessly transmit the second phase-shifted modulated signal to another device.

Third phase shifter 362 is configured to receive the differential pair of in-phase signals and the differential pair of quadrature signals and output a third phase-shifted modulated signal. For example, third vector summer 333 may selectively combine one or more of the first signal of the differential pair of in-phase signals, the second signal of the differential pair of in-phase signals, the first signal of the differential pair of quadrature signals, and the second signal of the differential pair of quadrature signals to generate a third phase-shifted version of the modulated signal. In accordance with an embodiment, third vector summer 333 applies a scaling factor such that the amplitude of the combined one or more of the first signal of the differential pair of in-phase signals, the second signal of the differential pair of in-phase signals, the first signal of the differential pair of quadrature signals, and the second signal of the differential pair of quadrature signals is equal to the amplitude of the modulated signal received by quadrature hybrid 302. The third phase-shifted modulated signal is received by matching network 370.

Matching network 370 includes a fifth transformer 375 (which includes a thirteenth inductor 381 a fourteenth inductor 383) and a variable capacitor 385. Thirteenth inductor 381 has a center tap coupled to power source 388. Thirteenth inductor 381, fourteenth inductor 383, and variable capacitor 385 are collectively configured to provide a conjugate match for the output impedance of the port(s) of third vector summer 333 that provide the third phase-shifted modulated signal and the input impedance of third antenna 378 to minimize power loss.

Third antenna 378 is configured to wirelessly transmit the third phase-shifted modulated signal to another device.

Fourth phase shifter 364 is configured to receive the differential pair of in-phase signals and the differential pair of quadrature signals and output a fourth phase-shifted modulated signal. For example, fourth vector summer 335 may selectively combine one or more of the first signal of the differential pair of in-phase signals, the second signal of the differential pair of in-phase signals, the first signal of the differential pair of quadrature signals, and the second signal of the differential pair of quadrature signals to generate a fourth phase-shifted version of the modulated signal. In accordance with an embodiment, fourth vector summer 335 applies a scaling factor such that the amplitude of the combined one or more of the first signal of the differential pair of in-phase signals, the second signal of the differential pair of in-phase signals, the first signal of the differential pair of quadrature signals, and the second signal of the differential pair of quadrature signals is equal to the amplitude of the modulated signal received by quadrature hybrid 302. The fourth phase-shifted modulated signal is received by matching network 372.

Matching network 372 includes a sixth transformer 377 (which includes fifteenth inductor 387 and a sixteenth inductor 389) and a variable capacitor 391. Fifteenth inductor 387 has a center tap coupled to power source 388. Fifteenth inductor 387, sixteenth inductor 389, and variable capacitor 391 are collectively configured to provide a conjugate match for the output impedance of the port(s) of fourth vector summer 335 that provide the fourth phase-shifted modulated signal and the input impedance of fourth antenna 380 to minimize power loss.

Fourth antenna 380 is configured to wirelessly transmit the fourth phase-shifted modulated signal to another device.

Figure 4:
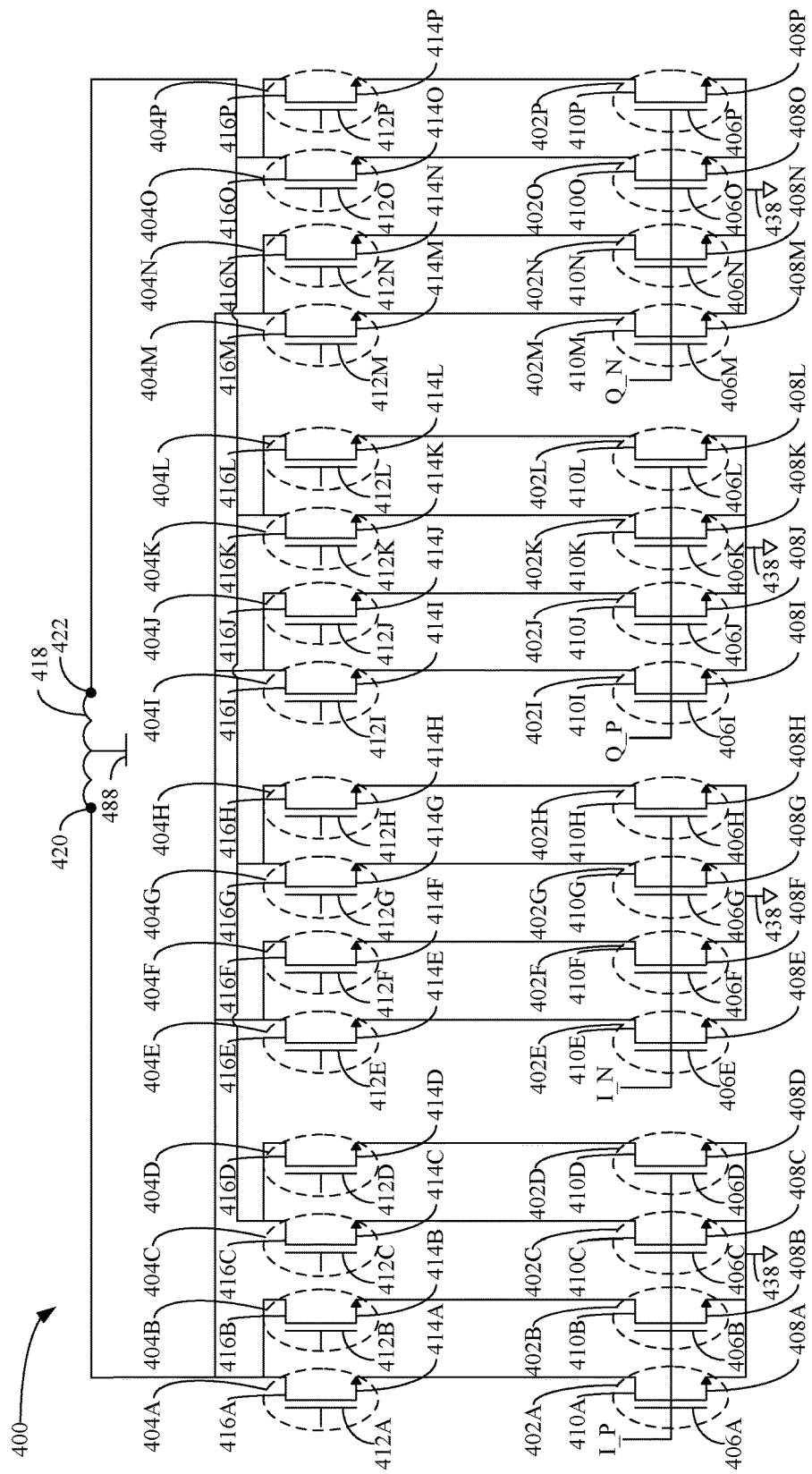
FIG. 4 depicts diagram of a vector summer in accordance with an embodiment.

FIG. 4 depicts diagram of a vector summer 400 in accordance with an embodiment. Vector summer 400 may be an example of first vector summer 329, second vector summer 331, third vector summer 333, or fourth vector summer 335, as shown in FIG. 3. As shown in FIG. 4, vector summer 400 includes a first switching element 402A, a second switching element 402B, a third switching element 402C, a fourth switching element 402D, a fifth switching element 402E, sixth switching element 402F, a seventh switching element 402G, an eighth switching element 402H, a ninth switching element 402I, a tenth switching element 402J, an eleventh switching element 402K, a twelfth switching element 402L, a thirteenth switching element 402M, a fourteenth switching element 402N, a fifteenth switching element 402O, a sixteenth switching element 402P, a first cascode switching element 404A, a second cascode switching element 404B, a third cascode switching element 404C, a fourth cascode switching element 404D, a fifth cascode switching element 404E, sixth cascode switching element 404F, a seventh cascode switching element 404G, an eighth cascode switching element 404H, a ninth cascode switching element 404I, a tenth cascode switching element 404J, an eleventh cascode switching element 404K, a twelfth cascode switching element 404L, a thirteenth cascode switching element 404M, a fourteenth cascode switching element 404N, a fifteenth cascode switching element 404O, a sixteenth cascode switching element 404P, and an inductor 418. Inductor 418 is an example of ninth inductor 382, eleventh inductor 390, thirteenth inductor 381, or fifteenth inductor 387, as shown in FIG. 3. Inductor 418 has a center tap coupled to a power source 488. Power source 488 is an example of power source 388, as shown in FIG. 3.

First switching element 402A comprises a gate terminal 406A, a source terminal 408A, and a drain terminal 410A. Second switching element 402B comprises a gate terminal 406B, a source terminal 408B, and a drain terminal 410B. Third switching element 402C comprises a gate terminal 406C, a source terminal 408C, and a drain terminal 410C. Fourth switching element 402D comprises a gate terminal 406D, a source terminal 408D, and a drain terminal 410D.

Fifth switching element 402E comprises a gate terminal 406E, a source terminal 408E, and a drain terminal 410E. Sixth switching element 402F comprises a gate terminal 406F, a source terminal 408F, and a drain terminal 410F. Seventh switching element 402G comprises a gate terminal 406G, a source terminal 408G, and a drain terminal 410G. Eighth switching element 402H comprises a gate terminal 406H, a source terminal 408H, and a drain terminal 410H. Ninth switching element 402I comprises a gate terminal 406I, a source terminal 408I, and a drain terminal 410I. Tenth switching element 402J comprises a gate terminal 406J, a source terminal 408J, and a drain terminal 410J. Eleventh switching element 402K comprises a gate terminal 406K, a source terminal 408K, and a drain terminal 410K. Twelfth switching element 402L comprises a gate terminal 406L, a source terminal 408L, and a drain terminal 410L. Thirteenth switching element 402M comprises a gate terminal 406M, a source terminal 408M, and a drain terminal 410M. Fourteenth switching element 402N comprises a gate terminal 406N, a source terminal 408N, and a drain terminal 410N. Fifteenth switching element 402O comprises a gate terminal 406O, a source terminal 408O, and a drain terminal 410O. Sixteenth switching element 402P comprises a gate terminal 406P, a source terminal 408P, and a drain terminal 410P.

First cascode switching element 404A comprises a gate terminal 412A, a source terminal 414A, and a drain terminal 416A. Second cascode switching element 404B comprises a gate terminal 412B, a source terminal 414B, and a drain terminal 416B. Third cascode switching element 404C comprises a gate terminal 412C, a source terminal 414C, and a drain terminal 416C. Fourth cascode switching element 404D comprises a gate terminal 412D, a source terminal 414D, and a drain terminal 416D. Fifth cascode switching element 404E comprises a gate terminal 412E, a source terminal 414E, and a drain terminal 416E. Sixth cascode switching element 404F comprises a gate terminal 412F, a source terminal 414F, and a drain terminal 416F. Seventh cascode switching element 404G comprises a gate terminal 412G, a source terminal 414G, and a drain terminal 416G. Eighth cascode switching element 404H comprises a gate terminal 412H, a source terminal 414H, and a drain terminal 416H. Ninth cascode switching element 404I comprises a gate terminal 412I, a source terminal 414I, and a drain terminal 416I. Tenth cascode switching element 404J comprises a gate terminal 412J, a source terminal 414J, and a drain terminal 416J. Eleventh cascode switching element 404K comprises a gate terminal 412K, a source terminal 414K, and a drain terminal 416K. Twelfth cascode switching element 404L comprises a gate terminal 412L, a source terminal 414L, and a drain terminal 416L. Thirteenth cascode switching element 404M comprises a gate terminal 412M, a source terminal 414M, and a drain terminal 416M. Fourteenth cascode switching element 404N comprises a gate terminal 412N, a source terminal 414N, and a drain terminal 416N. Fifteenth cascode switching element 404O comprises a gate terminal 412O, a source terminal 414O, and a drain terminal 416O. Sixteenth cascode switching element 404P comprises a gate terminal 412P, a source terminal 414P, and a drain terminal 416P.

Each of source terminals 406A-406P are coupled to a ground 438. Drain terminal 410A is coupled to source terminal 414A. Drain terminal 410B is coupled to source terminal 414B. Drain terminal 410C is coupled to source terminal 414C. Drain terminal 410D is coupled to source terminal 414D. Drain terminal 410E is coupled to source terminal 414E. Drain terminal 410F is coupled to source terminal 414F. Drain terminal 410G is coupled to source terminal 414G. Drain terminal 410H is coupled to source terminal 414H. Drain terminal 410I is coupled to source terminal 414I. Drain terminal 410J is coupled to source terminal 414J. Drain terminal 410K is coupled to source terminal 414K. Drain terminal 410L is coupled to source terminal 414L. Drain terminal 410M is coupled to source terminal 414M. Drain terminal 410N is coupled to source terminal 414N. Drain terminal 410O is coupled to source terminal 414O. Drain terminal 410P is coupled to source terminal 414P. Drain terminals 416A, 416B, 416E, 416F, 416I, 416J, 416M, and 416N are coupled to a first terminal 420 of inductor 418. Drain terminals 416C, 416D, 416G, 416H, 416K, 416L, 416O, and 416P are coupled to a second terminal 422 of inductor 418.

Gate terminals 406A-406D are configured to receive the first signal of the differential pair of in-phase signals (e.g., from quadrature hybrid 302 and I-matching network 306A, as shown in FIG. 3). In the embodiment shown in FIG. 4, the first signal of the differential pair of in-phase signals has a positive polarity (shown in FIG. 4 as I_P). Gate terminals 406E-406H are configured to receive the second signal of the differential pair of in-phase signals (e.g., from quadrature hybrid 302 and I-matching network 306A, as shown in FIG. 3). In the embodiment shown in FIG. 4, the second signal of the differential pair of in-phase signals has a negative polarity (shown in FIG. 4 as I_N). Gate terminals 406I-406L are configured to receive the first signal of the differential pair of quadrature signals (e.g., from quadrature hybrid 302 and Q-matching network 306B, as shown in FIG. 3). In the embodiment shown in FIG. 4, the first signal of the differential pair of quadrature signals has a positive polarity (shown in FIG. 4 as Q_P). Gate terminals 406M-406P are configured to receive the second signal of the differential pair of quadrature signals (e.g., from quadrature hybrid 302 and Q-matching network 306B, as shown in FIG. 3). In the embodiment shown in FIG. 4, the second signal of the differential pair of quadrature signals has a negative polarity (shown in FIG. 4 as Q_N).

Each of switching elements 402A-402D may be configured to apply a scaling factor to I_P to reduce the amplitude thereof, each of switching elements 402E-402H may be configured to apply a scaling factor to I_N to reduce the amplitude thereof, each of switching elements 402I-402L may be configured to apply a scaling factor to Q_P to reduce the amplitude thereof, and each of switching elements 402M-402P may be configured to apply a scaling factor to Q_N to reduce the amplitude thereof. This ensures that the resulting phase-shifted modulated signal has the same amplitude as the original modulated signal (i.e., the modulated signal before it has been phase-shifted). The scaling factor may be achieved by utilizing a certain number of gate fingers of one or more unit cells that collectively comprise first switching element 402A, second switching element 402B, third switching element 402C, fourth switching element 402D, fifth switching element 402E, sixth switching element 402F, seventh switching element 402G, eighth switching element 402H, ninth switching element 402I, tenth switching element 402J, eleventh switching element 402K, twelfth switching element 402L, thirteenth switching element 402M, fourteenth switching element 402N, fifteenth switching element 402O, and/or sixteenth switching element 402P.

In accordance with an embodiment, each of first switching element 402A, third switching element 402C, fifth switching element 402E, seventh switching element 402G, ninth switching element 402I, eleventh switching element 402K, thirteenth switching element 402M, and fifteenth switching element 402O comprise four gate fingers and each of second switching element 402B, fourth switching element 402D, sixth switching element 402F, eighth switching element 402H, tenth switching element 402J, twelfth switching element 402L, fourteenth switching element 402N, and sixteenth switching element 402P each comprise six gate fingers. The amount in which a signal's amplitude is reduced is decreased as the number of gate fingers used for a switching element increases. In accordance with such an embodiment, first switching element 402A and third switching element 402C provide a first amplitude-reduced I_P signal, second switching element 402B and fourth switching element 402D provide a second amplitude-reduced I_P signal, fifth switching element 402E and seventh switching element 402G provide a first amplitude-reduced I_N signal, sixth switching element 402F and eighth switching element 402H provide a second amplitude-reduced I_N signal, ninth switching element 402I and eleventh switching element 402K provide a first amplitude-reduced Q_P signal, tenth switching element 402J and twelfth switching element 402L provide a second amplitude-reduced Q_P signal, thirteenth switching element 402M and fifteenth switching element 402O provide a first amplitude-reduced Q_N signal, and fourteenth switching element 402N and sixteenth switching element 402P provide a second amplitude-reduced Q_N signal.

Inductor 418 is configured to selectively combine one or more of the first amplitude-reduced I_P signal, second amplitude-reduced I_P signal, first amplitude-reduced I_N signal, second amplitude-reduced I_N signal, first amplitude-reduced Q_P signal, second amplitude-reduced Q_P signal, first amplitude-reduced Q_N signal, and/or second amplitude-reduced Q_N signal to provide a differential pair of phase-shifted modulated signals.

One or more of the first amplitude-reduced I_P signal, second amplitude-reduced I_P signal, first amplitude-reduced I_N signal, second amplitude-reduced I_N signal, first amplitude-reduced Q_P signal, second amplitude-reduced Q_P signal, first amplitude-reduced Q_N signal, second amplitude-reduced Q_N signal are selected for combination based on one or more control signals received by gate terminals 412A-412P. For example, gate terminal 412A is configured to receive a first control signal, which, when asserted, causes the first amplitude-reduced I_P signal to be provided to first terminal 420 of inductor 418. Gate terminal 412B is configured to receive a second control signal, which, when asserted, causes the second amplitude-reduced I_P signal to be provided to first terminal 420 of inductor 418. Gate terminal 412C is configured to receive a third control signal, which, when asserted, causes the first amplitude-reduced I_P signal to be provided to second terminal 422 of inductor 418. Gate terminal 412D is configured to receive a fourth control signal, which, when asserted, causes second amplitude-reduced I_P signal to be provided to second terminal 420 of inductor 418.

Gate terminal 412E is configured to receive a fifth control signal, which, when asserted, causes the first amplitude-reduced I_N signal to be provided to first terminal 420 of inductor 418. Gate terminal 412F is configured to receive a sixth control signal, which, when asserted, causes the second amplitude-reduced I_N signal to be provided to first terminal 420 of inductor 418. Gate terminal 412G is configured to receive a seventh control signal, which, when asserted, causes the first amplitude-reduced I_N signal to be provided to second terminal 422 of inductor 418. Gate terminal 412H is configured to receive an eighth control signal, which, when asserted, causes the second amplitude-reduced I_N signal to be provided to second terminal 420 of inductor 418.

Gate terminal 412I is configured to receive a ninth control signal, which, when asserted, causes the first amplitude-reduced Q_P signal to be provided to first terminal 420 of inductor 418. Gate terminal 412J is configured to receive a tenth control signal, which, when asserted, causes the second amplitude-reduced Q_P to be provided to first terminal 420 of inductor 418. Gate terminal 412K is configured to receive an eleventh control signal, which, when asserted, causes the first amplitude-reduced Q_P to be provided to second terminal 422 of inductor 418. Gate terminal 412L is configured to receive a twelfth control signal, which, when asserted, causes the second amplitude-reduced Q_P to be provided to second terminal 420 of inductor 418.

Gate terminal 412M is configured to receive a thirteenth control signal, which, when asserted, causes the first amplitude-reduced Q_N to be provided to first terminal 420 of inductor 418. Gate terminal 412N is configured to receive a fourteenth control signal, which, when asserted, causes the second amplitude-reduced Q_N to be provided to first terminal 420 of inductor 418. Gate terminal 412O is configured to receive a fifteenth control signal, which, when asserted, causes the first amplitude-reduced Q_N to be provided to second terminal 422 of inductor 418. Gate terminal 412P is configured to receive a sixteenth control signal, which, when asserted, causes the second amplitude-reduced Q_N to be provided to second terminal 420 of inductor 418.

Each of the first-sixteenth control signals may be selectively asserted to achieve a desired phase shift for the modulated signal. For example, to achieve a phase shift of 0 degrees, the first, second, seventh, and eighth control signals are asserted, thereby causing first cascode switching element 404A, second cascode switching element 404B, seventh cascode switching element 404G, and eighth cascode switching element 404H to be activated. As a result, the first and second amplitude-reduced I_P signals are provided to first terminal 420 of inductor 418, and the first and second amplitude-reduced I_P are provided to second terminal 422 of inductor 418. Inductor 418 combines the first and second amplitude-reduced I_P to output a first signal of a differential pair of modulated signals that has been phase shifted by 0 degrees and combines the first and second amplitude I_N signals to output a second signal of the differential pair of modulated signals has been phase-shifted by 180 degrees (i.e., the complement of 0 degrees).

To achieve a phase shift of 45 degrees, the second, eighth, tenth, and sixteenth control signals are asserted, thereby causing second cascode switching element 404B, eight cascode switching element 404H, tenth cascode switching element 404J, and sixteenth cascode switching element 404P to be activated. As a result, the second amplitude-reduced I_P signal and the second amplitude-reduced Q_P signal are provided to first terminal 420 of inductor 418, and the second amplitude-reduced I_N signal and the second amplitude-reduced Q_N signal are provided to second terminal 422 of inductor 418. Inductor 418 combines the second amplitude-reduced I_P signal and the second amplitude-reduced Q_P signal to output a first signal of a differential pair of modulated signals that has been phase shifted by 45 degrees and combines the second amplitude-reduced I_N signal and the second amplitude-reduced Q_N signal to output a second signal of the differential pair of modulated signals has been phase-shifted by 225 degrees (i.e., the complement of 45 degrees).

To achieve a phase shift of 90 degrees, the ninth, tenth, fifteenth, and sixteenth control signals are asserted, thereby causing ninth cascode switching element 404I, tenth cascode switching element 404J, fifteenth cascode switching element 404O, and sixteenth cascode switching element 404P to be activated. As a result, the first and second amplitude-reduced Q_P signals are provided to first terminal 420 of inductor 418, and the first and second amplitude-reduced Q_N signals are provided to second terminal 422 of inductor 418. Inductor 418 combines the first and second amplitude-reduced Q_P signals to output a first signal of a differential pair of modulated signals that has been phase shifted by 90 degrees and combines the first and second amplitude-reduced Q_N signals to output a second signal of the differential pair of modulated signals has been phase-shifted by 270 degrees (i.e., the complement of 90 degrees).

To achieve a phase shift of 135 degrees, the fourth, sixth, tenth, and sixteenth control signals are asserted, thereby causing fourth cascode switching element 404D, sixth cascode switching element 404F, tenth cascode switching element 404J, and sixteenth cascode switching element 404P to be activated. As a result, the second amplitude-reduced I_N signal and the second amplitude-reduced Q_P signal are provided to first terminal 420 of inductor 418, and the second amplitude-reduced I_P signal and the second amplitude-reduced I_N signal are provided to second terminal 422 of inductor 418. Inductor 418 combines the second amplitude-reduced I_N signal and the second amplitude-reduced Q_P signal to output a first signal of a differential pair of modulated signals that has been phase shifted by 135 degrees and combines the second amplitude-reduced I_P signal and the second amplitude-reduced Q_N signal to output a second signal of the differential pair of modulated signals has been phase-shifted by 315 degrees (i.e., the complement of 135 degrees).

To achieve a phase shift of 180 degrees, the third, fourth, fifth, and sixth control signals are asserted, thereby causing third cascode switching element 404C, fourth cascode switching element 404D, fifth cascode switching element 404E, and seventh cascode switching element 404F to be activated. As a result, the first and second amplitude-reduced I_N signals are provided to first terminal 420 of inductor 418, and the first and second amplitude-reduced I_P signals are provided to second terminal 422 of inductor 418. Inductor 418 combines the first and second amplitude-reduced I_N signals to output a first signal of a differential pair of modulated signals that has been phase shifted by 180 degrees and combines the first and second amplitude-reduced I_P signals to output a second signal of the differential pair of modulated signals has been phase-shifted by 0 degrees (i.e., the complement of 180 degrees).

To achieve a phase shift of 225 degrees, the fourth, sixth, twelfth, and fourteenth control signals are asserted, thereby causing fourth cascode switching element 404D, sixth cascode switching element 404F, twelfth cascode switching element 404L, and fourteenth cascode switching element 404N to be activated. As a result, the second amplitude-reduced I_N signal and second amplitude-reduced Q_N signal are provided to first terminal 420 of inductor 418, and the second amplitude-reduced I_P signal and the second amplitude-reduced Q_P signal are provided to second terminal 422 of inductor 418. Inductor 418 combines the second amplitude-reduced I_N signal and second amplitude-reduced Q_N signal to output a first signal of a differential pair of modulated signals that has been phase shifted by 225 degrees and combines the second amplitude-reduced I_P signal and the second amplitude-reduced Q_P signal to output a second signal of the differential pair of modulated signals has been phase-shifted by 45 degrees (i.e., the complement of 225 degrees).

To achieve a phase shift of 270 degrees, the eleventh, twelfth, thirteenth, and fourteenth control signals are asserted, thereby causing eleventh cascode switching element 404K, twelfth cascode switching element 404L, thirteenth cascode switching element 404M, and fourteenth cascode switching element 404N to be activated. As a result, the first and second amplitude-reduced Q_N signals are provided to first terminal 420 of inductor 418, and the first and second amplitude-reduced Q_Ps signal are provided to second terminal 422 of inductor 418. Inductor 418 combines the first and second amplitude-reduced Q_N signals to output a first signal of a differential pair of modulated signals that has been phase shifted by 270 degrees and combines the first and second amplitude-reduced Q_P signals to output a second signal of the differential pair of modulated signals has been phase-shifted by 90 degrees (i.e., the complement of 270 degrees).

To achieve a phase shift of 315 degrees, the second, eighth, twelfth, and fourteenth control signals are asserted, thereby causing second cascode switching element 404B, eighth cascode switching element 404H, twelfth cascode switching element 404L, and fourteenth cascode switching element 404N to be activated. As a result, the second amplitude-reduced I_P signal and the second amplitude-reduced Q_N signal are provided to first terminal 420 of inductor 418, and the second amplitude-reduced I_N signal and the second amplitude-reduced Q_P signal are provided to second terminal 422 of inductor 418. Inductor 418 combines the second amplitude-reduced I_P signal and the second amplitude-reduced Q_N signal to output a first signal of a differential pair of modulated signals that has been phase shifted by 315 degrees and combines the second amplitude-reduced I_N signal and the second amplitude-reduced Q_P signal to output a second signal of the differential pair of modulated signals has been phase-shifted by 135 degrees (i.e., the complement of 315 degrees).

The differential pair of phase-shifted modulated signals may be converted to a single-ended phase-shifted modulated signals (e.g., by a power amplifier) and received by an antenna (e.g., first antenna 374, second antenna 376, third antenna 378, or fourth antenna 380, as shown in FIG. 3).

It is noted that while switching elements 402A-402P and switching elements 404A-404P of vector summer 400 are depicted as n-channel metal oxide semiconductor field effect transistors (MOSFETs), it is contemplated herein that vector summer 400 may be modified to use other types of switching devices, as would be understood by persons of skill in the relevant art(s) have the benefit of this disclosure. For example, switching elements 402A-402P and switching elements 404A-404P may implemented using p-channel MOSFETS. It is also noted that while FIG. 4 shows vector summer 400 being implemented using 32 switching elements (i.e., switching elements 402A-402P and switching elements 404A-404P), it is contemplated herein that vector summer 400 may be implemented using any number of switching elements.

It is further noted that several different transistor topologies may be used to implement vector summer 400 other than that shown in FIG. 4.

Figure 5:
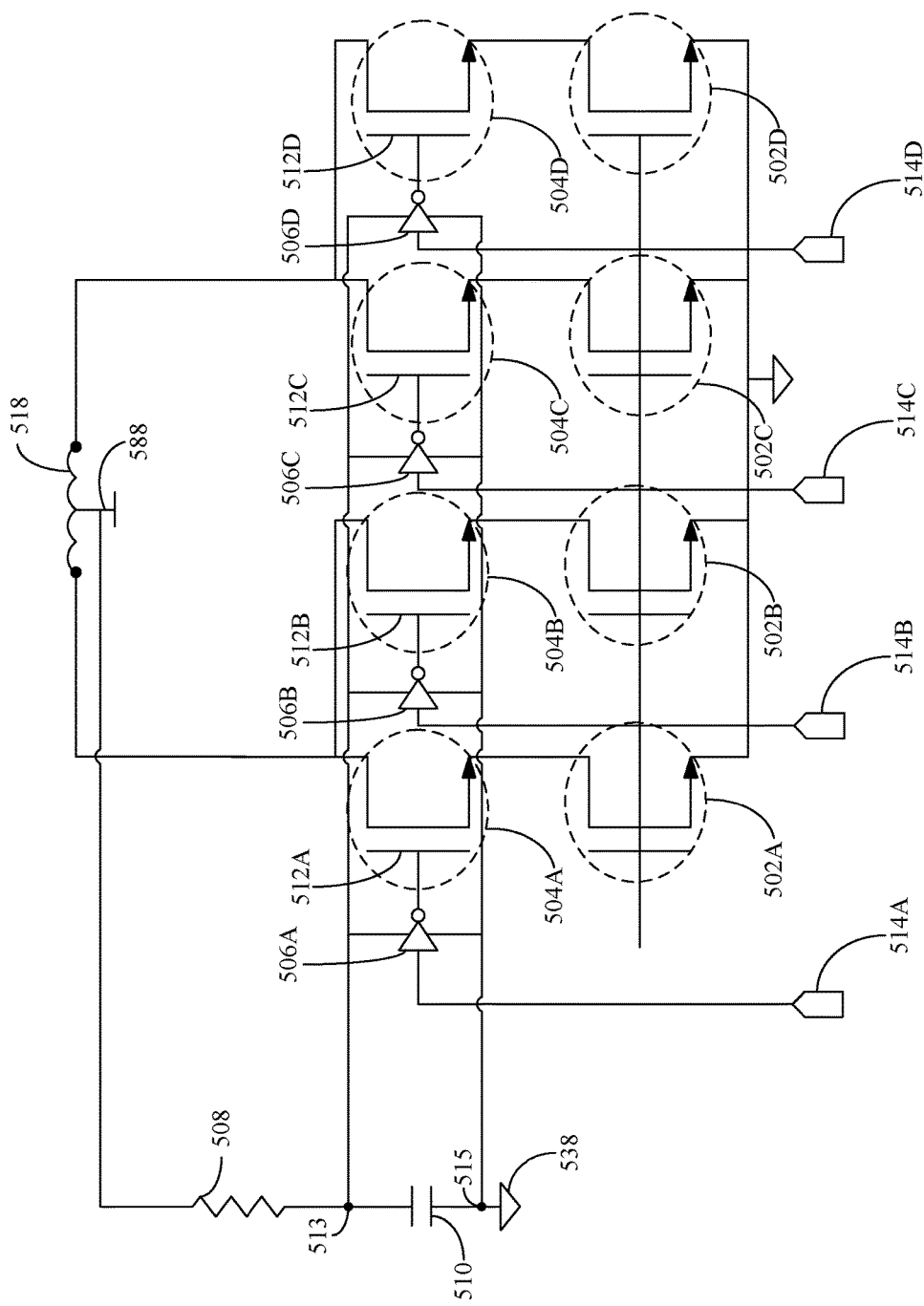
FIG. 5 depicts a diagram of a partial vector summer in which control signals are provided to cascode switching devices in accordance with an embodiment.

Control signals may be provided to first-sixteenth cascode switching devices 404A-404P in many ways. For example, FIG. 5 depicts a diagram of a partial vector summer 500 in which control signals are provided to a first cascode switching device 504A, a second cascode switching device 504B, a third cascode switching device 504C, and a fourth cascode switching device 504D in accordance with an embodiment. As shown in FIG. 5, partial vector summer 500 includes a first switching device 502A, a second switching device 502B, a third switching device 502C, a fourth switching device 502D, first cascode switching device 504A, second cascode switching device 504B, third cascode switching device 504C, fourth cascode switching device 504D, and an inductor 518. Inductor 518 has a center tap coupled to a power source 588. Switching devices 502A-502D are examples of switching devices 402A-402D, switching devices 402E-402H, switching devices 402I-402L, and/or switching devices 402M-402P, as shown in FIG. 4. Cascode switching devices 504A-504D are examples of cascode switching devices 404A-404D, cascode switching devices 404E-404H, cascode switching devices 404I-404L, and/or cascode switching devices 404M-404P, as shown in FIG. 4. Inductor 518 is an example of inductor 418, as shown in FIG. 4.

As further shown in FIG. 5, partial vector summer 500 includes a first inverter 506A, a second inverter 506B, a third inverter 506C, a fourth inverter 506D, a resistor 508, and a capacitor 510. Resistor 508 is coupled to power source 588 and a node 513. Capacitor 510 is coupled to node 513 and a node 515. Node 515 is coupled to a ground 538. Each of first inverter 506A, second inverter 506B, third inverter 506C, and fourth inverter 506D are coupled to node 513 and node 515. Resistor 508 and capacitor 510 may be configured to, as a whole or in any combination, reduce a current and/or lower a voltage level of the power provided to each of first inverter 506A, second inverter 506B, third inverter 506C, and fourth inverter 506D such that it is suitable for powering each of first inverter 506A, second inverter 506B, third inverter 506C, and fourth inverter 506D.

First inverter 506A is coupled to a gate terminal 512A of first cascode switching element 504A. Second inverter 506B is coupled to a gate terminal 512B of second cascode switching element 504B. Third inverter 506C is coupled to a gate terminal 512C of third cascode switching element 504C. Fourth inverter 506D is coupled to a gate terminal 512D of fourth cascode switching element 504D.

A first control signal may be provided to first inverter 506A via an input port 514A. A second control signal may be provided to second inverter 506B via an input port 514B. A third control signal may be provided to third inverter 506C via an input port 514C. A fourth control signal may be provided to fourth inverter 506A via an input port 514D. Accordingly, to activate first cascode switching element 504A, first control signal may be asserted low (e.g., a '0' (logical low signal value)) and provided to first inverter 506A. To activate second cascode switching element 504B, second control signal may be asserted low (e.g., a '0' (logical low signal value)) and provided to second inverter 506B. To activate third cascode switching element 504C, third control signal may be asserted low (e.g., a '0' (logical low signal value)) and provided to third inverter 506C. To activate fourth cascode switching element 504D, fourth control signal may be asserted low (e.g., a '0' (logical low signal value)) and provided to fourth inverter 506D.

Figure 6:
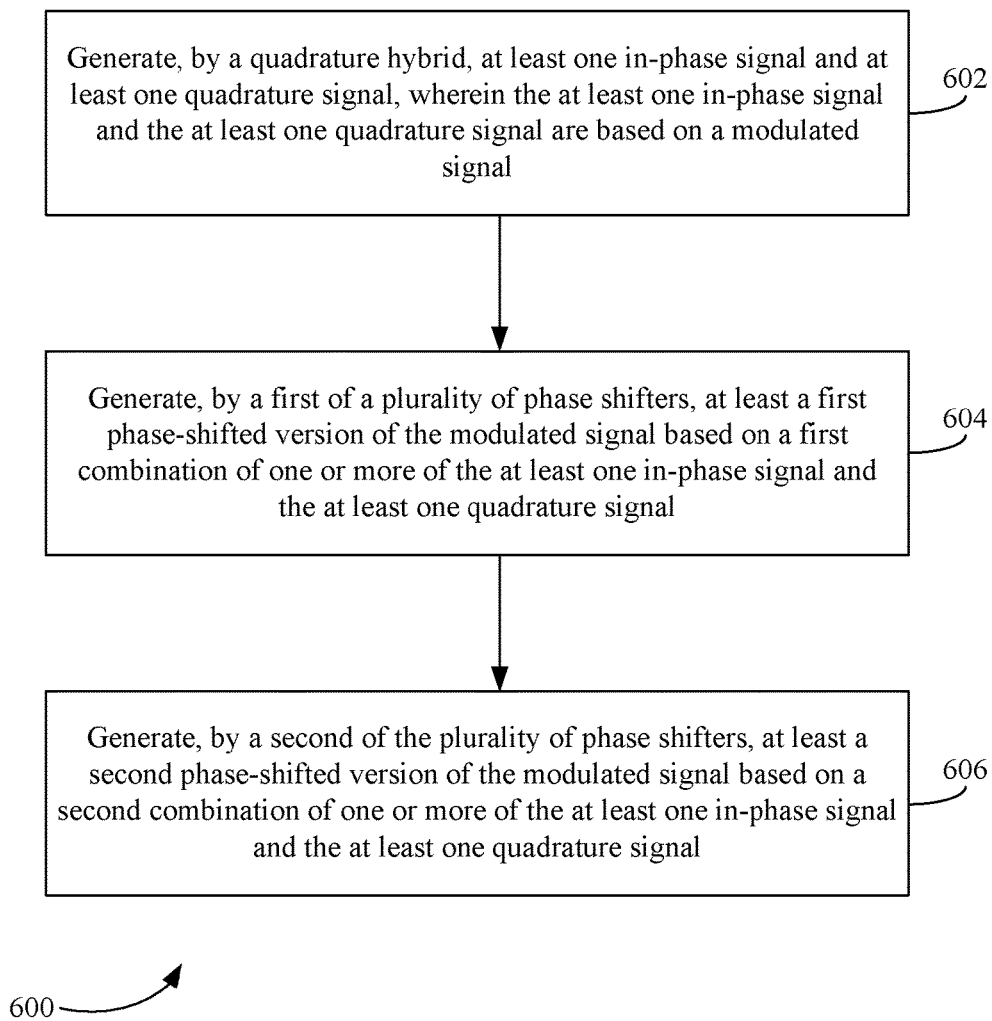
FIG. 6 shows a flowchart providing example steps for generating a phase-shifted modulated signal in a transmit path of a transceiver in accordance with an embodiment.

Accordingly, in embodiments, a phase-shifted modulated signal may be generated in a transmit path of a transceiver in many ways. For example, FIG. 6 shows a flowchart 600 providing example steps for generating a phase-shifted modulated signal in a transmit path of a transceiver in accordance with an embodiment. Transceiver 100 as shown in FIG. 1, transmit path 200 as shown in FIG. 2, transmit path 300 as shown in FIG. 3, vector summer 400 of FIG. 4 and partial vector summer 500 of FIG. 5 may each operate according to flowchart 600. The method of flowchart 600 will now be described with continued reference to transmit path 300 of FIG. 3, although the method is not limited to that implementation. Other structural and operational embodiments will be apparent to persons skilled in the relevant art(s) based on the discussion regarding flowchart 600 and transmit path 300. Flowchart 600 is described as follows.

As shown in FIG. 6, at least one in phase-signal and at least one quadrature signal is generated by quadrature hybrid, wherein the at least one in-phase signal and the at least one quadrature signal are based on a modulated signal (602). For example, with reference to FIG. 3, quadrature hybrid 302 generates at least one in phase signal (e.g., a differential pair of in-phase signals and at least one quadrature signal based (e.g., a differential pair of quadrature signals) on a modulated signal. The at least one in phase signal and the at least one quadrature signal are received at first phase shifter 358, second phase shifter 360, third phase shifter 362, and fourth phase shifter 364.

In accordance with one or more embodiments, the output impedance of the quadrature hybrid is matched to the input impedance of the plurality of phase shifters. For example, with reference to FIG. 3, matching network 306 provides a conjugate match for the output impedance of quadrature hybrid 302 and the input impedance of first phase shifter 358, second phase shifter 360, third phase shifter 362, and fourth phase shifter 364.

In accordance with one or more embodiments, the at least one in-phase signal comprises a differential pair of in-phase signals.

In accordance with one or more embodiments, the at least one quadrature signal comprises a differential pair of quadrature signals.

Continuing with flowchart 600, at least a first phase-shifted version of the modulated signal is generated by a first of a plurality of phase shifters based on a first combination of one or more of the at least one in-phase signal and the at least one quadrature signal (604). For example, with reference to FIG. 3, first phase shifter 358 generates a first phase-shifted version of the modulated signal based on a first combination of one or more of the at least one in-phase signal and the at least one quadrature signal provided by quadrature hybrid 302.

Continuing with flowchart 600, at least a second phase-shifted version of the modulated signal is generated by a second of the plurality of phase shifters based on a second combination of one or more of the at least one in-phase signal and the at least one quadrature signal (606). For example, with reference to FIG. 3, second phase shifter 360 generates a second phase-shifted version of the modulated signal based on a second combination of one or more of the at least one in-phase signal and the at least one quadrature signal provided by quadrature hybrid 302.

In accordance with one or more embodiments, the first phase-shifted version of the modulated signal generated by the first of the plurality of phase shifters is transmitted from a first antenna, and the second phase-shifted version of the modulated signal generated by the second of the plurality of phase shifters is transmitted from a second antenna. For example, with reference to FIG. 3, first antenna 374 transmits the first phase-shifted version of the modulated signal provided by first phase shifter 358, and second antenna 376 transmits the second phase-shifted version of the modulated signal provided by second phase shifter 360.

In accordance with one or more embodiments, an output impedance of the first of the plurality of phase shifters is matched to an input impedance of the first antenna, and an output impedance of the second of the plurality of phase shifters is matched to an input impedance of the second antenna. For example, with reference to FIG. 3, matching network 366 matches the output impedance of first phase shifter 358 to the input impedance of first antenna 374, and matching network 368 matches the output impedance of first phase shifter 360 to the input impedance of second antenna 376.

In accordance with one or more embodiments, the first phase-shifted version of the modulated signal and the second phase-shifted version of the modulated signal differ in phase.

In accordance with one or more embodiments, the amplitude of the at least one in-phase signal and the amplitude of the at least one quadrature signal are scaled such that the amplitude of the first phase-shifted version of the modulated signal is equal to the amplitude of the modulated signal and the amplitude of the second phase-shifted version of modulated signal is equal to the amplitude of the modulated signal. For example, with reference to FIG. 3, first phase shifter 358 scales the amplitude of the at least one in-phase signal and the amplitude of the at least one quadrature signal such that the amplitude of the first phase-shifted version of the modulated signal is equal to the amplitude of the modulated signal, and second phase shifter 360 scales the amplitude of the at least one in-phase signal and the amplitude of the at least one quadrature signal such that the amplitude of the second phase-shifted version of the modulated signal is equal to the amplitude of the modulated signal.

B. Phase-Shifted Modulated Signal Generation in a Receive Path

Figure 7:
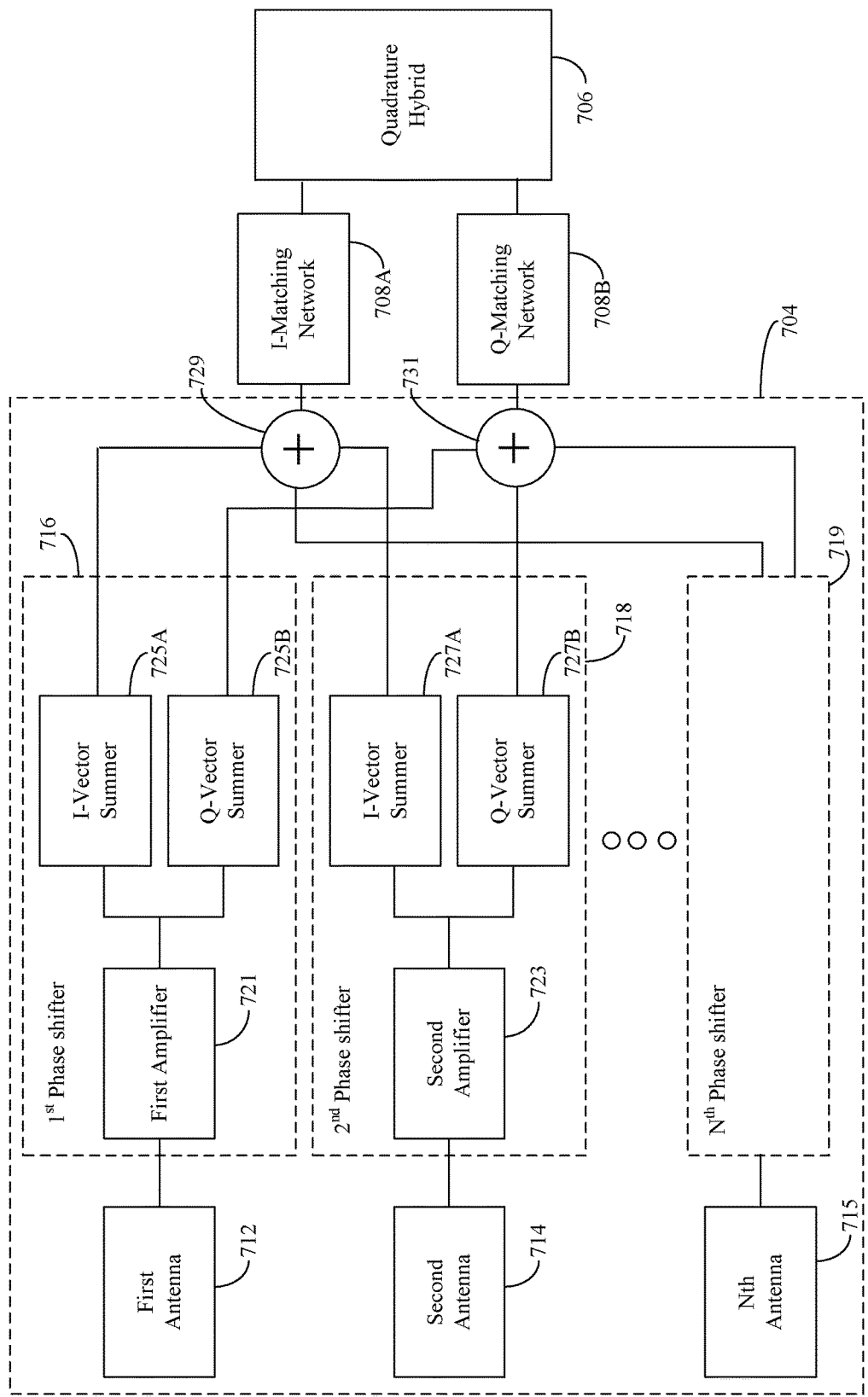
FIG. 7 depicts diagram of a receive path of a transceiver in accordance with an embodiment.

FIG. 7 depicts diagram of a receive path 700 of a transceiver (e.g., transceiver 100, as shown in FIG. 1) in accordance with an embodiment. As shown in FIG. 7, receive path 700 includes phased array of antennas 704, an I-matching network 708A, a Q-matching network 708B and a quadrature hybrid 706. Phased array of antennas 704 is an example of phased array of antennas 104, as shown in FIG. 1, and quadrature hybrid 706 is an example of second quadrature hybrid 106, as shown in FIG. 1.

Phased array of antennas 704 includes a first antenna 712, a second antenna 714, an Nth antenna 715, a first phase shifter 716, a second phase shifter 718, an Nth phase shifter 719, a first combiner 729, and a second combiner 731, where N is any positive integer.

First antenna 712, second antenna 714, and Nth antenna 715 are configured to wirelessly receive a modulated signal. First antenna 712 provides the received modulated signal to first phase shifter 716, second antenna 714 provides the received modulated signal to second phase shifter 718, and Nth antenna 715 provides the received modulated signal to Nth phase shifter 719. In accordance with an embodiment, the modulated signal is provided to first phase shifter 716, second phase shifter 718, and/or Nth phase shifter 719 as a differential pair of modulated signals. In accordance with another embodiment, the modulated signal is provided to first phase shifter 716, second phase shifter 718, and/or Nth phase shifter 719 as a single-ended modulated signal. Each of first phase shifter 716, second phase shifter 718, and/or Nth phase shifter 719 may modify the modulated signal in order to achieve a desired phase shift for the modulated signal.

First phase shifter 716 includes a first amplifier 721, an I-vector summer 725A and a Q-vector summer 725B. First amplifier 721 may be a low noise amplifier configured to filter noise from the modulated signal and provide the filtered, modulated signal to I-vector summer 725A and Q-vector summer 725B. Each of I-vector summer 725A and Q-vector summer 725B are configured to modify the amplitude of the filtered modified signal. I-vector summer 725A provides a first version of the amplitude-modified modulated signal to first combiner 729, and Q-vector summer 725B provides a second version of the amplitude-modified modulated signal to second combiner 731.

Second phase shifter 718 includes a second amplifier 723, an I-vector summer 727A and a Q-vector summer 727B. Second amplifier 723 may be a low noise amplifier that is configured to filter the modulated signal and provide the filtered, modulated signal to I-vector summer 727A and Q-vector summer 727B. Each of I-vector summer 727A and Q-vector summer 727B are configured to modify the amplitude of the filtered modified signal. I-vector summer 727A provides a first version of the amplitude-modified modulated signal to first combiner 729, and Q-vector summer 727B provides a second version of the amplitude-modified modulated signal to second combiner 731.

Nth phase shifter 719 is configured to operate in a similar manner as first phase shifter 716 and second phase shifter 718. Accordingly, Nth phase shifter 719 may also include an I-vector summer, Q-vector summer, and an amplifier. However, these components are not shown nor are described for sake of brevity. The Nth phase shifter 719 provides a first version of the amplitude-modified modulated signal to first combiner 729 and a second version of the amplitude-modified modulated signal to second combiner 731.

First combiner 729 combines (e.g. sums) each of the first versions of the amplitude modified modulated signals and provides a one or more combined modulated signals to I-matching network 708A. Second combiner 731 combines each of the second versions of the amplitude-modified modulated signals and provides one or more second combined modulated signal to Q-matching network 708B.

I-matching network 708A is configured to provide a conjugate match for the output impedance of port(s) of first phase shifter 716, second phase shifter 718, Nth phase shifter 719 and/or first combiner 729 (which provide the first combined modulated signal(s)) and the input impedance of quadrature hybrid 706 to minimize power loss.

Q-matching network 708B configured to provide a conjugate match for the output impedance of port(s) of first phase shifter 716, second phase shifter 718, and Nth phase shifter 719 and/or second combiner 731 (which provide the second combined modulated signal(s)) and the input impedance of quadrature hybrid 706 to minimize power loss.

Quadrature hybrid 706 is configured to combine a first combined modulated signal of the one or more first combined modulated signals with a quadrature version of the first combined modulated signal that is generated based on a second combined modulated signal of the one or more second combined modulated signals to output a phase-shifted version of the modulated signal received by first antenna 712, second antenna 714, and Nth antenna 715. In accordance with an embodiment, quadrature hybrid 706 is a passive quadrature generator.

As shown in FIG. 7, a single quadrature hybrid (i.e., quadrature hybrid 202) is used for an N number of phase shifter (i.e., first phase shifter 716, second phase shifter 718, and Nth phase shifter 719) rather than a single quadrature hybrid for each phase shifter.

Figure 8:
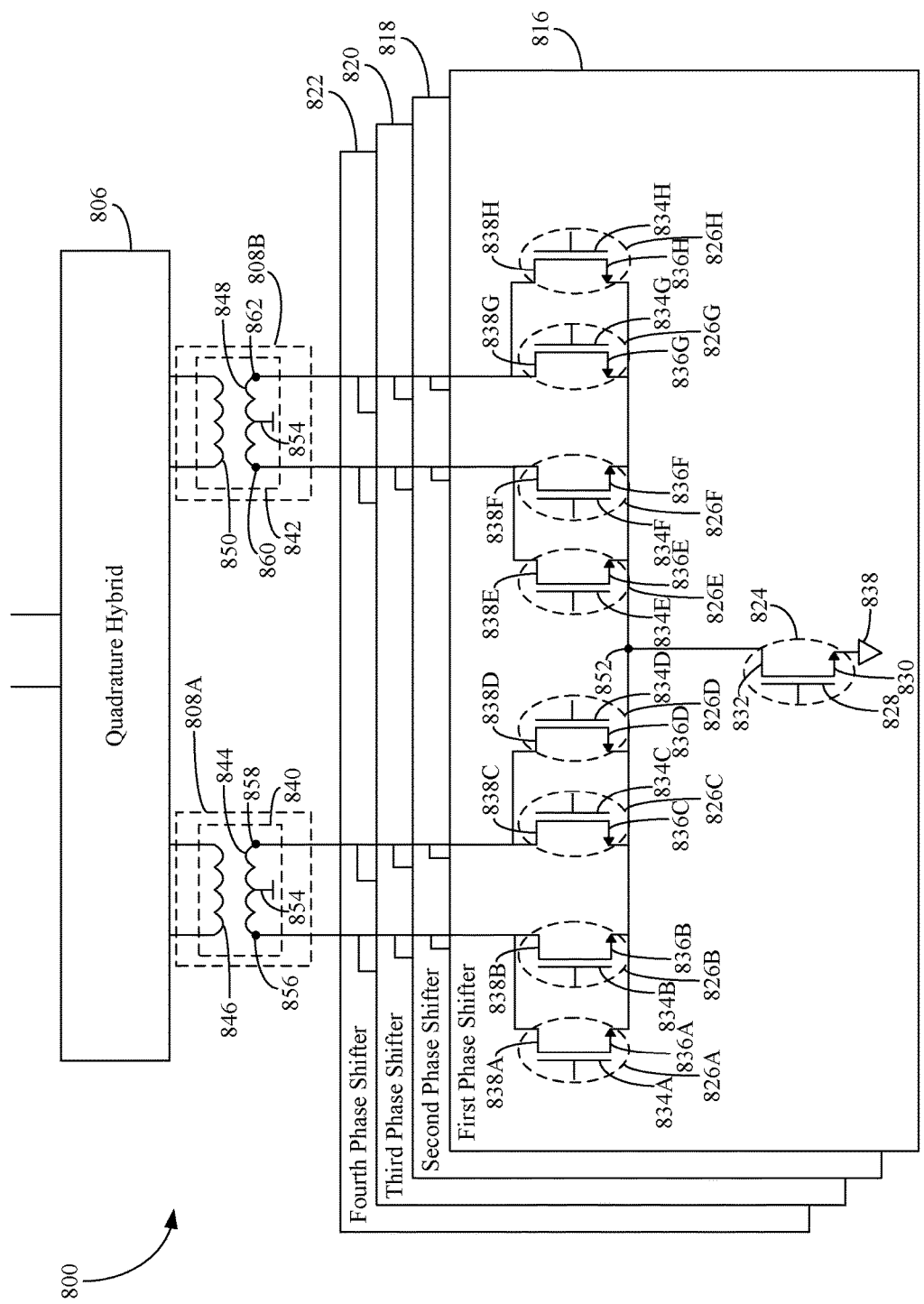
FIG. 8 depicts diagram of a receive path including four phase shifters coupled to a matching network and a quadrature hybrid in accordance with an embodiment.

FIG. 8 depicts diagram of a receive path 800 including four phase shifters (i.e., first phase shifter 816, second phase shifter 818, third phase shifter 820, and fourth phase shifter 822) coupled to an I-matching network 808A, a Q-matching network 808B, and a quadrature hybrid 806 in accordance with an embodiment. Receive path 800 is an example of receive path 700, as shown in FIG. 7. Each of first phase shifter 816, second phase shifter 818, third phase shifter 820, and fourth phase shifter 822 are an example of first phase shifter 716 or second phase shifter 718, as shown in FIG. 2. I-matching network 808A is an example of I-matching network 708A, as shown in FIG. 7. Q-matching network 808B is an example of Q-matching network 708B, as shown in FIG. 7. Quadrature hybrid 806 is an example of quadrature hybrid 706, as shown in FIG. 7.

Each of first phase shifter 816, second phase shifter 818, third phase shifter 820, and fourth phase shifter 822 includes a switching element 824, a switching element 826A, a switching element 826B, a switching element 826C, a switching element 826D, a switching element 826E, a switching element 826F, a switching element 826G, and a switching element 826H. Switching element 824 includes a gate terminal 828, a source terminal 830, and a drain terminal 832. Switching element 826A includes a gate terminal 834A, a source terminal 836A, and a drain terminal 838A. Switching element 826B includes a gate terminal 834B, a source terminal 836B, and a drain terminal 838B. Switching element 826C includes a gate terminal 834C, a source terminal 836C, and a drain terminal 838C. Switching element 826D includes a gate terminal 834D, a source terminal 836D, and a drain terminal 838D. Switching element 826E includes a gate terminal 834E, a source terminal 836E, and a drain terminal 838E. Switching element 826F includes a gate terminal 834F, a source terminal 836F, and a drain terminal 838F. Switching element 826G includes a gate terminal 834G, a source terminal 836G, and a drain terminal 838G. Switching element 826H includes a gate terminal 834H, a source terminal 836H, and a drain terminal 838H.

I-matching network 808A includes a first transformer 840, and Q-matching network 808B includes a second transformer 842. First transformer 840 includes a first inductor 844 and a second inductor 846. Transformer 842 includes a first inductor 848 and a second inductor 850. First inductor 844 and first inductor 848 each have a center tap coupled to a power source 854. I-matching network 808A and Q-matching network 808B are configured to provide a conjugate match for the output impedance of each of first phase shifter 816, second phase shifter 818, third phase shifter 820, and fourth phase shifter 822 and the input impedance of quadrature hybrid 806 to minimize power loss.

Source terminal 830 is coupled to a ground 838. Drain terminal 832 is coupled to a node 852. Gate terminal 828 is configured to receive a signal from an antenna (e.g., first antenna 712 or second antenna 714, as shown in FIG. 7). It is noted that one or more components may be coupled between switching element 824 and the antenna. One such component may be a low noise amplifier (not shown) that is configured to filter noise from the signal provided by the antenna. The modulated signal is provided to node 852 when the modulated signal is asserted.

Each of source terminals 836A-836H are coupled to node 852. Drain terminals 838A and 838B are coupled to a first terminal 856 of first inductor 856. Drain terminals 838C and 838D are coupled to a second terminal 858 of first inductor 856. Drain terminals 838E and 838F are coupled to a first terminal 860 of first inductor 848. Drain terminals 838G and 838H are coupled to a second terminal 862 of first inductor 848.

Switching elements 838A-838H, first terminal 856, second terminal 858, first terminal 860, and fourth terminal 832 may be collective representation of I-vector summer 725A, Q-vector summer 725B and first combiner 729 or may be collective representation of I-vector summer 727A, Q-vector summer 727B and second combiner 763.

Each of switching elements 826A-826H may be configured to apply a scaling factor to the modulated signal to reduce the amplitude thereof. This ensures that the resulting phase-shifted modulated signal has the same amplitude as the original modulated signal (i.e., the modulated signal before it has been phase-shifted). The scaling factor may be achieved by utilizing a certain number of gate fingers of one or more unit cells that collectively comprise switching element 826A, switching element 826B, switching element 826C, switching element 826D, switching element 826E, switching element 826F, switching element 826G, and/or switching element 826H.

In accordance with an embodiment, each of switching element 826A, switching element 826D, switching element 826E, and switching element 826H comprise six gate fingers and each of switching element 826B, switching element 826C, switching element 826F, and switching element 826G each comprise four gate fingers. The amount in which a signal's amplitude is reduced is decreased as the number of gate fingers used for a switching element increases. In accordance with such an embodiment, each of switching element 826A, switching element 826D, switching element 826EF, and switching element 826H (which each comprise six gate fingers) provide a first amplitude-reduced signal equating to approximately 60% of the strength of modulated signal provided by the antenna, and each of switching element 826B, switching element 826C, switching element 826F, and switching element 826G (which each comprise four gate fingers) provide a second amplitude-reduced signal equating to approximately 40% of the strength of modulated signal provided by the antenna One or more of the first and second amplitude-reduced signals from each of first phase shifter 816, second phase shifter 818, third phase shifter 820, and fourth phase shifter 822 are selectively routed to one or more of first terminal 856, second terminal 858, first terminal 860, and second terminal 862 based on one or more control signals provided to gate terminals 834A-834H. For example, gate terminal 834A is configured to receive a first control signal, which, when asserted, causes the first amplitude-reduced modulated signal to be provided to first terminal 856. Gate terminal 834B is configured to receive a second control signal, which, when asserted, causes the second amplitude-reduced modulated signal to be provided to first terminal 856. Gate terminal 834C is configured to receive a third control signal, which, when asserted, causes the second amplitude-reduced modulated signal to be provided to second terminal 858. Gate terminal 834D is configured to receive a fourth control signal, which, when asserted, causes the first amplitude-reduced modulated signal to be provided to second terminal 858. Gate terminal 834E is configured to receive a fifth control signal, which, when asserted, causes the first amplitude-reduced modulated signal to be provided to first terminal 860. Gate terminal 834F is configured to receive a sixth control signal, which, when asserted, causes the second amplitude-reduced modulated signal to be provided to first terminal 860. Gate terminal 834G is configured to receive a seventh control signal, which, when asserted, causes the second amplitude-reduced modulated signal to be provided to second terminal 862. Gate terminal 834H is configured to receive an eighth control signal, which, when asserted, causes the first amplitude-reduced modulated signal to be provided to second terminal 862.

The first and second amplitude-reduced signals received at first terminal 856 may have a first polarity, and the first and second amplitude-reduced signal received at second terminal 858 may have a second polarity that is opposite to the first polarity. Similarly, the first and second amplitude-reduced signals received at first terminal 860 may have a first polarity, and the first and second amplitude-reduced signal received at second terminal 862 may have a second polarity that is opposite to the first polarity. Accordingly, the first and second amplitude-reduced signals received at first terminal 856 and first terminal 860 may correspond to signals having a 0 degree phase shift, and the first and second amplitude-reduced signals received at second terminal 858 and second terminal 862 may correspond to signals having a 180 degree phase shift.

Transformer 840 is configured to combine (e.g., sum) each of the first and second amplitude-reduced signals received from each of first phase shifter 816, second phase shifter 818, third phase shifter 820, and fourth phase shifter 822 in phase and provides a first combined signal to quadrature hybrid 806. Transformer 842 is configured to combine (e.g., sum) each of the first and second amplitude-reduced signals received from each of first phase shifter 816, second phase shifter 818, third phase shifter 820, and fourth phase shifter 822 in phase and provides a second combined signal to quadrature hybrid 806.

Quadrature hybrid 806 is configured to delay the second combined signal by 90 degrees to generate a delayed, second combined signal. Quadrature hybrid 806 is further configured to combine the first combined signal with the delayed, second combined signal to output a phase-shifted modulated signal. In accordance with an embodiment, quadrature hybrid 806 performs a vector summation to combine the first combined signal with the delayed combined signal. Quadrature hybrid 806 may be implemented using a combination of one or more of a processor (e.g., processor 1000, as described with reference to FIG. 10), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

The following examples illustrate how to achieve different phase shifts in an embodiment in which each of switching element 826A, switching element 826D, switching element 826E, and switching element 826H comprise six gate fingers and each of switching element 826B, switching element 826C, switching element 826F, and switching element 826G each comprise four gate fingers, although the embodiments described herein are not so limited.

To achieve a phase shift of 0 degrees, the first and second control signals for each of first phase shifter 816, second phase shifter 818, third phase shifter 820, and fourth phase shifter 822 are asserted, thereby causing switching element 838A and switching element 838B from each of first phase shifter 816, second phase shifter 818, third phase shifter 820, and fourth phase shifter 822 to be activated. As a result, the first and second amplitude-reduced signals from each of first phase shifter 816, second phase shifter 818, third phase shifter 820, and fourth phase shifter 822 are provided to first terminal 856. First transformer 840 combines the received first and second amplitude signals and provides a first combined signal to quadrature hybrid 806. As described above, quadrature hybrid 806 is configured to combine the first combined signal with a second combined signal provided by transformer 842 that has been delayed 90 degrees. However, because no signals are provided to second transformer 842 from each of first phase shifter 816, second phase shifter 818, third phase shifter 820, and fourth phase shifter 822, quadrature hybrid 806 outputs the first combined signal, which is equivalent to the modulated signal provided to switching element 824 (i.e., first combined signal is a signal that has been phase-shifted by 0 degrees).

To achieve a phase shift of 22.5 degrees, the first, second, and sixth control signals for each of first phase shifter 816, second phase shifter 818, third phase shifter 820, and fourth phase shifter 822 are asserted, thereby causing switching element 838A, switching element 838B, and switching element 838G from each of first phase shifter 816, second phase shifter 818, third phase shifter 820, and fourth phase shifter 822 to be activated. As a result, the first and second amplitude-reduced signals received from each first phase shifter 816, second phase shifter 818, third phase shifter 820, and fourth phase shifter 822 are provided to first terminal 856, and the second amplitude-reduced signals received from first phase shifter 816, second phase shifter 818, third phase shifter 820, and fourth phase shifter 822 are provided to first terminal 860. First transformer 840 combines the received first and second amplitude-reduced signals and provides a first combined signal to quadrature hybrid 806. Second transformer 842 combines the received second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 22.5 degrees (e.g., a vector summation is performed using a first signal with a 0 degree phase shift having a magnitude of 1 (i.e., first combined signal) and a second signal with a 90 degree phase shift having a magnitude of 0.4 (i.e., delayed, second combined signal).

To achieve a phase shift of 45 degrees, the first, second, fifth, and sixth control signals for each of first phase shifter 816, second phase shifter 818, third phase shifter 820, and fourth phase shifter 822 are asserted, thereby causing switching element 838A, switching element 838B, switching element 838E, and switching element 838F from each of first phase shifter 816, second phase shifter 818, third phase shifter 820, and fourth phase shifter 822 to be activated. As a result, the first and second amplitude-reduced signals received from each first phase shifter 816, second phase shifter 818, third phase shifter 820, and fourth phase shifter 822 are provided to first terminal 856, and the first and second amplitude-reduced signals received from each first phase shifter 816, second phase shifter 818, third phase shifter 820, and fourth phase shifter 822 are provided to first terminal 860. First transformer 840 combines the received first and second amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 45 degrees (e.g., a vector summation is performed using a first signal with a 0 degree phase shift having a magnitude of 1 (i.e., first combined signal) and a second signal with a 90 degree phase shift having a magnitude of 1 (i.e., delayed, second combined signal).

To achieve a phase shift of 67.5 degrees, the second, fifth, and sixth control signals for each of first phase shifter 816, second phase shifter 818, third phase shifter 820, and fourth phase shifter 822 are asserted, thereby causing switching element 838A, switching element 838E, and switching element 838F from each of first phase shifter 816, second phase shifter 818, third phase shifter 820, and fourth phase shifter 822 to be activated. As a result, the second amplitude-reduced signals from each first phase shifter 816, second phase shifter 818, third phase shifter 820, and fourth phase shifter 822 are provided to first terminal 856, and the first and second amplitude-reduced signals from each first phase shifter 816, second phase shifter 818, third phase shifter 820, and fourth phase shifter 822 are provided to first terminal 860. First transformer 840 combines the received second amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 67.5 degrees (e.g., a vector summation is performed using a first signal with a 0 degree phase shift having a magnitude of 0.4 (i.e., first combined signal) and a second signal with a 90 degree phase shift having a magnitude of 1 (i.e., delayed, second combined signal).

To achieve a phase shift of 90 degrees, the fifth and sixth control signals for each of first phase shifter 816, second phase shifter 818, third phase shifter 820, and fourth phase shifter 822 are asserted, thereby causing switching element 838E and switching element 838F from each of first phase shifter 816, second phase shifter 818, third phase shifter 820, and fourth phase shifter 822 to be activated. As a result, the first and second amplitude-reduced signals from each of first phase shifter 816, second phase shifter 818, third phase shifter 820, and fourth phase shifter 822 are provided to first terminal 860. Second transformer 842 combines the received first and second amplitude signals and provides and delays the combined signal by 90 degrees. Because no signals are provided to first transformer 840 from each of first phase shifter 816, second phase shifter 818, third phase shifter 820, and fourth phase shifter 822, quadrature hybrid 806 outputs the delayed, combined signal, which is equivalent to the modulated signal provided to switching element 824 that has been phase-shifted by 90 degrees.

To achieve a phase shift of 112.5 degrees, the third, fifth, and sixth control signals for each of first phase shifter 816, second phase shifter 818, third phase shifter 820, and fourth phase shifter 822 are asserted, thereby causing switching element 838C, switching element 838E, and switching element 838F from each of first phase shifter 816, second phase shifter 818, third phase shifter 820, and fourth phase shifter 822 to be activated. As a result, the second amplitude-reduced signals from each first phase shifter 816, second phase shifter 818, third phase shifter 820, and fourth phase shifter 822 are provided to second terminal 858, and the first and second amplitude-reduced signals from each first phase shifter 816, second phase shifter 818, third phase shifter 820, and fourth phase shifter 822 are provided to first terminal 860. First transformer 840 combines the received amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 112.5 degrees (e.g., a vector summation is performed using a first signal with a 180 degree phase shift having a magnitude of 0.4 (i.e., first combined signal) and a second signal with a 90 degree phase shift having a magnitude of 1 (i.e., delayed, second combined signal).

To achieve a phase shift of 135 degrees, the third, fourth, fifth, and sixth control signals for each of first phase shifter 816, second phase shifter 818, third phase shifter 820, and fourth phase shifter 822 are asserted, thereby causing switching element 838C, switching element 838D, switching element 838E, and switching element 838F from each of first phase shifter 816, second phase shifter 818, third phase shifter 820, and fourth phase shifter 822 to be activated. As a result, the first and second amplitude-reduced signals received from each first phase shifter 816, second phase shifter 818, third phase shifter 820, and fourth phase shifter 822 are provided to second terminal 858, and the first and second amplitude-reduced signals received from each first phase shifter 816, second phase shifter 818, third phase shifter 820, and fourth phase shifter 822 are provided to first terminal 860. First transformer 840 combines the received first and second amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 135 degrees (e.g., a vector summation is performed using a first signal with a 180 degree phase shift having a magnitude of 1 (i.e., first combined signal) and a second signal with a 90 degree phase shift having a magnitude of 1 (i.e., delayed, second combined signal).

To achieve a phase shift of 157.5 degrees, the third, fourth, and sixth control signals for each of first phase shifter 816, second phase shifter 818, third phase shifter 820, and fourth phase shifter 822 are asserted, thereby causing switching element 838C, switching element 838D, and switching element 838F from each of first phase shifter 816, second phase shifter 818, third phase shifter 820, and fourth phase shifter 822 to be activated. As a result, the first and second amplitude-reduced signals from each first phase shifter 816, second phase shifter 818, third phase shifter 820, and fourth phase shifter 822 are provided to second terminal 858, and the second amplitude-reduced signals from each first phase shifter 816, second phase shifter 818, third phase shifter 820, and fourth phase shifter 822 are provided to first terminal 860. First transformer 840 combines the received first and second amplitude-reduced signals and provides a first combined signal to quadrature hybrid 806. Second transformer 842 combines the received second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 157.5 degrees (e.g., a vector summation is performed using a first signal with a 180 degree phase shift having a magnitude of 1 (i.e., first combined signal) and a second signal with a 90 degree phase shift having a magnitude of 0.4 (i.e., delayed, second combined signal).

To achieve a phase shift of 180 degrees, the third and fourth control signals for each of first phase shifter 816, second phase shifter 818, third phase shifter 820, and fourth phase shifter 822 are asserted, thereby causing switching element 838C and switching element 838D from each of first phase shifter 816, second phase shifter 818, third phase shifter 820, and fourth phase shifter 822 to be activated. As a result, the first and second amplitude-reduced signals from each of first phase shifter 816, second phase shifter 818, third phase shifter 820, and fourth phase shifter 822 are provided to second terminal 858. First transformer 840 combines the received first and second amplitude signals to provide a combined signal. Because no signals are provided to second transformer 842 from each of first phase shifter 816, second phase shifter 818, third phase shifter 820, and fourth phase shifter 822, quadrature hybrid 806 outputs the combined signal, which is equivalent to the modulated signal provided to switching element 824 that has been phase-shifted by 180 degrees.

To achieve a phase shift of 202.5 degrees, the third, fourth, and seventh control signals for each of first phase shifter 816, second phase shifter 818, third phase shifter 820, and fourth phase shifter 822 are asserted, thereby causing switching element 838C, switching element 838D, and switching element 838G from each of first phase shifter 816, second phase shifter 818, third phase shifter 820, and fourth phase shifter 822 to be activated. As a result, the first and second amplitude-reduced signals from each first phase shifter 816, second phase shifter 818, third phase shifter 820, and fourth phase shifter 822 are provided to second terminal 858, and the second amplitude-reduced signals from each first phase shifter 816, second phase shifter 818, third phase shifter 820, and fourth phase shifter 822 are provided to second terminal 862. First transformer 840 combines the received first and second amplitude-reduced signals and provides a first combined signal to quadrature hybrid 806. Second transformer 842 combines the received second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 202.5 degrees (e.g., a vector summation is performed using a first signal with a 180 degree phase shift having a magnitude of 1 (i.e., first combined signal) and a second signal with a 270 degree phase shift having a magnitude of 0.4 (i.e., delayed, second combined signal).

To achieve a phase shift of 225 degrees, the third, fourth, seventh, and eighth control signals for each of first phase shifter 816, second phase shifter 818, third phase shifter 820, and fourth phase shifter 822 are asserted, thereby causing switching element 838C, switching element 838D, switching element 838G, and switching element 838H from each of first phase shifter 816, second phase shifter 818, third phase shifter 820, and fourth phase shifter 822 to be activated. As a result, the first and second amplitude-reduced signals received from each first phase shifter 816, second phase shifter 818, third phase shifter 820, and fourth phase shifter 822 are provided to second terminal 858, and the first and second amplitude-reduced signals received from each first phase shifter 816, second phase shifter 818, third phase shifter 820, and fourth phase shifter 822 are provided to second terminal 862. First transformer 840 combines the received first and second amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 225 degrees (e.g., a vector summation is performed using a first signal with a 180 degree phase shift having a magnitude of 1 (i.e., first combined signal) and a second signal with a 270 degree phase shift having a magnitude of 1 (i.e., delayed, second combined signal).

To achieve a phase shift of 247.5 degrees, the third, seventh, and eighth control signals for each of first phase shifter 816, second phase shifter 818, third phase shifter 820, and fourth phase shifter 822 are asserted, thereby causing switching element 838C, switching element 838G, and switching element 838H from each of first phase shifter 816, second phase shifter 818, third phase shifter 820, and fourth phase shifter 822 to be activated. As a result, the second amplitude-reduced signals from each first phase shifter 816, second phase shifter 818, third phase shifter 820, and fourth phase shifter 822 are provided to second terminal 858, and the first and second amplitude-reduced signals from each first phase shifter 816, second phase shifter 818, third phase shifter 820, and fourth phase shifter 822 are provided to second terminal 862. First transformer 840 combines the received second amplitude-reduced signals and provides a first combined signal to quadrature hybrid 806. Second transformer 842 combines the received second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 247.5 degrees (e.g., a vector summation is performed using a first signal with a 180 degree phase shift having a magnitude of 0.4 (i.e., first combined signal) and a second signal with a 270 degree phase shift having a magnitude of 1 (i.e., delayed, second combined signal).

To achieve a phase shift of 270 degrees, the seventh and eighth control signals for each of first phase shifter 816, second phase shifter 818, third phase shifter 820, and fourth phase shifter 822 are asserted, thereby causing switching element 838G and switching element 838H from each of first phase shifter 816, second phase shifter 818, third phase shifter 820, and fourth phase shifter 822 to be activated. As a result, the first and second amplitude-reduced signals from each of first phase shifter 816, second phase shifter 818, third phase shifter 820, and fourth phase shifter 822 are provided to second terminal 862. Second transformer 842 combines the received first and second amplitude signals and provides and delays the combined signal by 90 degrees. Because no signals are provided to first transformer 840 from each of first phase shifter 816, second phase shifter 818, third phase shifter 820, and fourth phase shifter 822, quadrature hybrid 806 outputs the delayed, combined signal, which is equivalent to the modulated signal provided to switching element 824 that has been phase-shifted by 270 degrees.

To achieve a phase shift of 292.5 degrees, the second, seventh, and eighth control signals for each of first phase shifter 816, second phase shifter 818, third phase shifter 820, and fourth phase shifter 822 are asserted, thereby causing switching element 838B, switching element 838G, and switching element 838H from each of first phase shifter 816, second phase shifter 818, third phase shifter 820, and fourth phase shifter 822 to be activated. As a result, the second amplitude-reduced signals from each first phase shifter 816, second phase shifter 818, third phase shifter 820, and fourth phase shifter 822 are provided to first terminal 856, and the first and second amplitude-reduced signals from each first phase shifter 816, second phase shifter 818, third phase shifter 820, and fourth phase shifter 822 are provided to second terminal 862. First transformer 840 combines the received second amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 292.5 degrees (e.g., a vector summation is performed using a first signal with a 0 degree phase shift having a magnitude of 0.4 (i.e., first combined signal) and a second signal with a 270 degree phase shift having a magnitude of 1 (i.e., delayed, second combined signal).

To achieve a phase shift of 315 degrees, the first, second, seventh, and eighth control signals for each of first phase shifter 816, second phase shifter 818, third phase shifter 820, and fourth phase shifter 822 are asserted, thereby causing switching element 838A, switching element 838B, switching element 838G, and switching element 838H from each of first phase shifter 816, second phase shifter 818, third phase shifter 820, and fourth phase shifter 822 to be activated. As a result, the first and second amplitude-reduced signals received from each first phase shifter 816, second phase shifter 818, third phase shifter 820, and fourth phase shifter 822 are provided to first terminal 856, and the first and second amplitude-reduced signals received from each first phase shifter 816, second phase shifter 818, third phase shifter 820, and fourth phase shifter 822 are provided to second terminal 862. First transformer 840 combines the received first and second amplitude-reduced signals and provides a first combined signal to quadrature hybrid 806. Second transformer 842 combines the received first and second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 315 degrees (e.g., a vector summation is performed using a first signal with a 0 degree phase shift having a magnitude of 1 (i.e., first combined signal) and a second signal with a 270 degree phase shift having a magnitude of 1 (i.e., delayed, second combined signal).

To achieve a phase shift of 337.5 degrees, the first, second, and seventh control signals for each of first phase shifter 816, second phase shifter 818, third phase shifter 820, and fourth phase shifter 822 are asserted, thereby causing switching element 838A, switching element 838B, and switching element 838G from each of first phase shifter 816, second phase shifter 818, third phase shifter 820, and fourth phase shifter 822 to be activated. As a result, the first and second amplitude-reduced signals from each first phase shifter 816, second phase shifter 818, third phase shifter 820, and fourth phase shifter 822 are provided to first terminal 856, and the second amplitude-reduced signals from each first phase shifter 816, second phase shifter 818, third phase shifter 820, and fourth phase shifter 822 are provided to second terminal 862. First transformer 840 combines the received first and second amplitude-reduced signals and provides a first combined signal to quadrature hybrid 806. Second transformer 842 combines the received second amplitude-reduced signals and provides a second combined signal to quadrature hybrid 806. Quadrature hybrid 806 delays the second combined signal by 90 degrees to provide a delayed, second combined signal and combines the delayed, second combined signal with the first combined signal to output a modulated signal that has been phase shifted 337.5 degrees (e.g., a vector summation is performed using a first signal with a 0 degree phase shift having a magnitude of 1 (i.e., first combined signal) and a second signal with a 270 degree phase shift having a magnitude of 0.4 (i.e., delayed, second combined signal).

In accordance with an embodiment, the phase-shifted modulated signal outputted by quadrature hybrid 806 may be a differential phase-shifted modulated signal (as shown in FIG. 8). In accordance with another embodiment, the phase-shifted modulated signal outputted by quadrature hybrid 806 may be a single-ended phase-shifted modulated signal It is noted that while switching elements 824 and 826A-826H of phase shifters 816, 818, 820, and 822 are depicted as n-channel MOSFETs, it is contemplated herein that phase shifters 816, 818, 820, and 822 may be modified to use other types of switching devices, as would be understood by persons of skill in the relevant art(s) have the benefit of this disclosure. For example, switching elements 824 and 826A-826H may implemented using p-channel MOSFETS.

Figure 9:
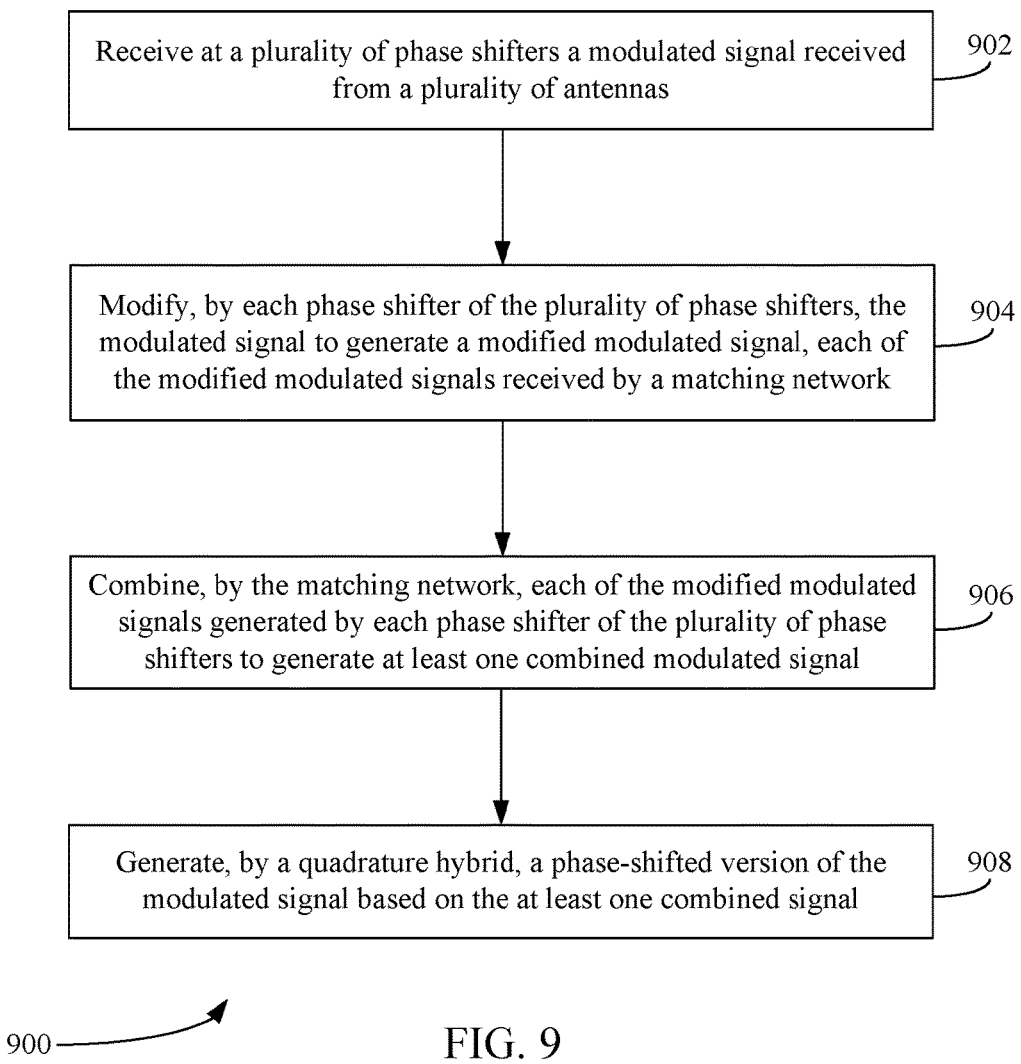
FIG. 9 shows a flowchart providing example steps for generating a phase-shifted modulated signal in a receive path of a transceiver in accordance with an embodiment.

Accordingly, in embodiments, a phase-shifted modulated signal may be generated in a receive path of a transceiver in many ways. For example, FIG. 9 shows a flowchart 900 providing example steps for generating a phase-shifted modulated signal in a receive path of a transceiver in accordance with an embodiment. Transceiver 100 as shown in FIG. 1, receive path 700 as shown in FIG. 7, and receive path 800 as shown in FIG. 8, may each operate according to flowchart 900. The method of flowchart 900 will now be described with continued reference to receive path 700 of FIG. 7, although the method is not limited to that implementation. Other structural and operational embodiments will be apparent to persons skilled in the relevant art(s) based on the discussion regarding flowchart 900 and receive path 700. Flowchart 900 is described as follows.

As shown in FIG. 9, a modulated signal received from a plurality of antennas is provided to a plurality of phase shifters (902). For example, with reference to FIG. 7, first antenna 712 receives a modulated signal and provides it to first phase shifter 716, and second antenna 714 receives a modulated signal and provides it to second phase shifter 718.

Continuing with flowchart 900, the modulated signal is modified by each phase shifter of the plurality of phase shifters to provide a modified modulated signal, each of the modified modulated signals being provided to a matching network (904). For example, with reference to FIG. 7, first phase shifter 716 and second phase shifter 718 each modify the modulated signal and each provide a modified modulated signal. The modified modulated signals are provided to matching network 708.

In one or more embodiments, each phase shifter of the plurality of phase shifters modifies the modulated signal by reducing the amplitude of the modulated signal. For example, with reference to FIG. 7, each of first phase shifter 716 and second phase shifter 718 modifies the received modulated signal by reducing its amplitude.

Continuing with flowchart 900, each of the modified modulated signals provided by each phase shifter of the plurality of phase shifters are combined by the matching network to generate at least one combined modulated signal (906). For example, with reference to FIG. 7, each of the modified modulated signals provided by first phase shifter 716 and second phase shifter 718 are combined by matching network 708 to generate at least one combined modulated signal.

In accordance with one or more embodiments, the at least one combined signal comprises a first combined signal and a second combined signal.

In accordance with one or more embodiments, the quadrature hybrid generates the phase-shifted version of the modulated signal based on the at least one combined signal by delaying the second combined signal to generate a delayed, second combined signal and combining the first combined signal with the delayed, second combined signal. For example, with reference to FIG. 7, quadrature hybrid 706 delays the second combined signal to generate the delayed, second combined signal and combines the first combined signal with the delayed, second combined signal.

In accordance with one or more embodiments, the matching network matches an output impedance of the plurality of phase shifters to an input impedance of the quadrature hybrid. For example, with reference to FIG. 7, matching network 708 matches the output impedance of first phase shifter 716 and second phase shifter 718 to the input impedance of quadrature hybrid 706.

Continuing with flowchart 900, a phase-shifted version of the modulated signal is generated by quadrature hybrid based on the at least one combined signal (908). For example, with reference with FIG. 7, quadrature hybrid 706 generates a phase-shifted version of the modulated signal based on the at least one combined signal.

Example Processor Implementation

Transceiver embodiments described herein, such as transceiver 100, along with any respective components/subcomponents thereof, and/or any flowcharts, further systems, sub-systems, components, and/or embodiments disclosed herein may be implemented in hardware (e.g., hardware logic/electrical circuitry), or any combination of hardware with one or both of software (computer program code or instructions configured to be executed in one or more processors or processing devices) and firmware. In embodiments with respect to the example computer implementations in this Section, main memory, memory cards and memory sticks, memory devices, and/or the like may include and or implement the described techniques and embodiments.

Figure 10:
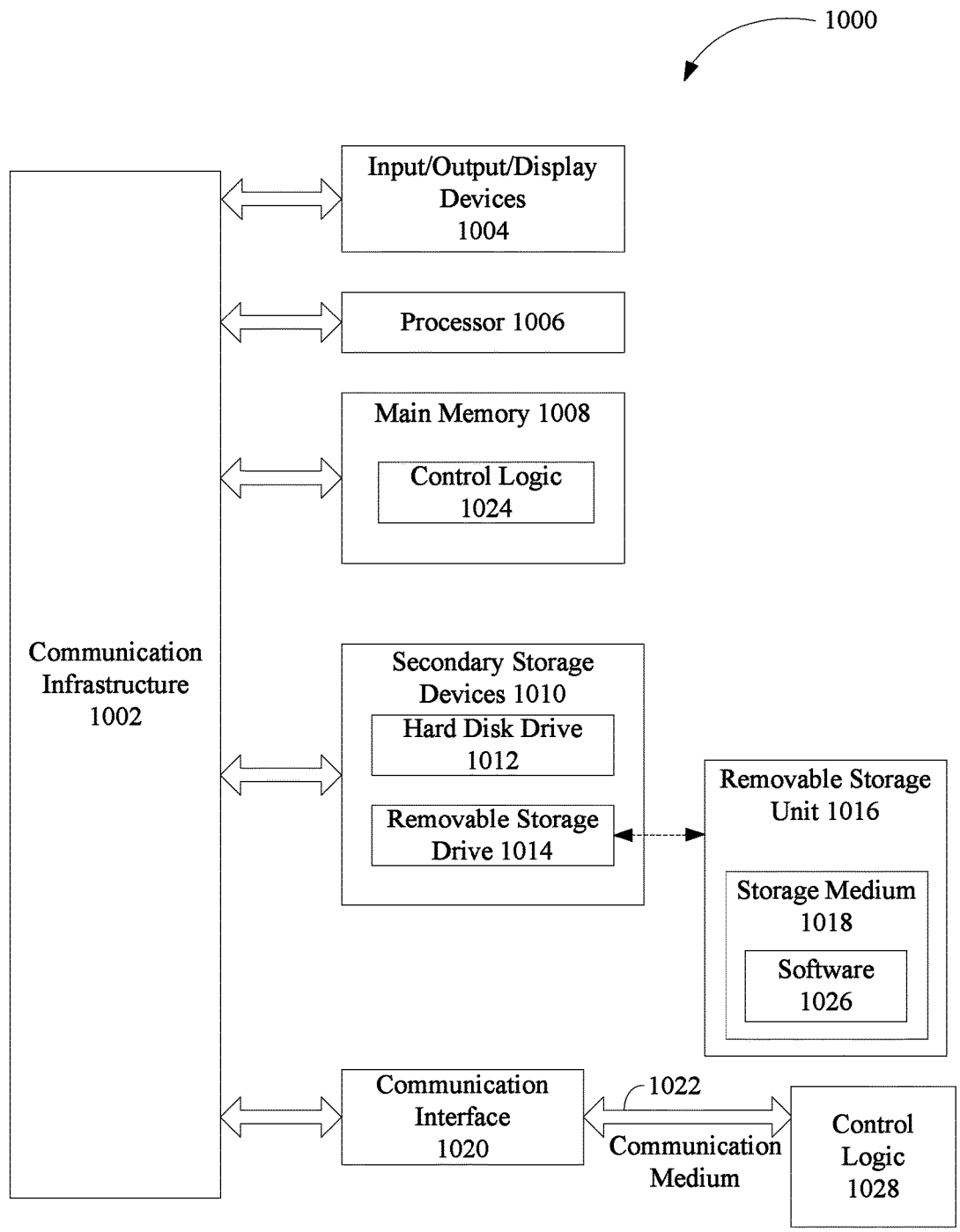
FIG. 10 shows a block diagram of a processing device/system in which the techniques disclosed herein may be performed and the embodiments herein may be utilized.

The embodiments described herein, including circuitry, devices, systems, methods/processes, and/or apparatuses, may be implemented in or using well known processing devices, communication systems, servers, and/or, computers, such as a processing device 1000 shown in FIG. 10. It should be noted that processing device 1000 may represent mobile devices, communication devices/systems, entertainment systems/devices, processing devices, and/or traditional computers in one or more embodiments. For example, a transceiver as described herein, and any of the sub-systems and/or components respectively contained therein and/or associated therewith, may be implemented in or using one or more processing devices 1000 and/or similar computing devices.

Processing device 1000 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1000 may be any type of computer, including a desktop computer, a server, etc., and may be a computing device or system within another device or system.

Processing device 1000 includes one or more processors (also called central processing units, or CPUs), such as a processor 1006. Processor 1006 is connected to a communication infrastructure 1002, such as a communication bus. In some embodiments, processor 1006 can simultaneously operate multiple computing threads, and in some embodiments, processor 1006 may comprise one or more processors.

Processing device 1000 also includes a primary or main memory 1008, such as random access memory (RAM). Main memory 1008 has stored therein control logic 1024 (computer software), and data.

Processing device 1000 also includes one or more secondary storage devices 1010. Secondary storage devices 1010 include, for example, a hard disk drive 1012 and/or a removable storage device or drive 1014, as well as other types of storage devices, such as memory cards and memory sticks. For instance, processing device 1000 may include an industry standard interface, such a universal serial bus (USB) interface for interfacing with devices such as a memory stick. Removable storage drive 1014 represents a floppy disk drive, a magnetic tape drive, a compact disk drive, an optical storage device, tape backup, etc.

Removable storage drive 1014 interacts with a removable storage unit 1016. Removable storage unit 1016 includes a computer useable or readable storage medium 1018 having stored therein computer software 1026 (control logic) and/or data. Removable storage unit 1016 represents a floppy disk, magnetic tape, compact disk, DVD, optical storage disk, or any other computer data storage device. Removable storage drive 1014 reads from and/or writes to removable storage unit 1016 in a well-known manner.

Processing device 1000 also includes input/output/display devices 1004, such as touchscreens, LED and LCD displays, monitors, keyboards, pointing devices, etc.

Processing device 1000 further includes a communication or network interface 1020. Communication interface 1020 enables processing device 1000 to communicate with remote devices. For example, communication interface 1020 allows processing device 1000 to communicate over communication networks or mediums 1022 (representing a form of a computer useable or readable medium), such as LANs, WANs, the Internet, etc. Network interface 1020 may interface with remote sites or networks via wired or wireless connections.

Control logic 1028 may be transmitted to and from processing device 1000 via the communication medium 1022.

Any apparatus or manufacture comprising a computer useable or readable medium having control logic (software) stored therein is referred to herein as a computer program product or program storage device. This includes, but is not limited to, processing device 1000, main memory 1008, secondary storage devices 1010, and removable storage unit 1016. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of circuits, devices, apparatuses, and systems. For instance, embodiments may be included, without limitation, in processing devices (e.g., illustrated in FIG. 10) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. § 101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 1006 of FIG. 10), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

CONCLUSION

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A method, comprising:
    receiving at a plurality of phase shifters a modulated signal received from a plurality of antennas;
    modifying, by each phase shifter of the plurality of phase shifters, the modulated signal to generate a modified modulated signal, each of the modified modulated signals received by a matching network;
    combining, by the matching network, each of the modified modulated signals generated by each phase shifter of the plurality of phase shifters to generate at least one combined modulated signal;
    generating, by a quadrature hybrid, a phase-shifted version of the modulated signal based on the at least one combined modulated signal; and
    matching, by the matching network, an output impedance of the plurality of phase shifters to an input impedance of the quadrature hybrid.

2. The method of claim 1, wherein the at least one combined signal comprises a first combined signal and a second combined signal.

3. The method of claim 2, wherein generating, by the quadrature hybrid, the phase-shifted version of the modulated signal based on the at least one combined signal comprises:
    delaying the second combined signal to generate a delayed, second combined signal; and
    combining the first combined signal with the delayed, second combined signal to generate the phase-shifted version of the modulated signal.

4. The method of claim 1, wherein modifying, by each phase shifter of the plurality of phase shifters, the modulated signal comprises:
    reducing an amplitude of the modulated signal.

5. A receiver, comprising:
    a plurality of phase shifters configured to receive a modulated signal from a plurality of antennas, wherein each phase shifter of the plurality of phase shifters is configured to modify the modulated signal to generate a modified modulated signal;
    matching network circuitry configured to receive each of the modified modulated signals generated by the plurality of phase shifters and combine each of the modified modulated signals to generate at least one combined modulated signal; and
    a quadrature hybrid configured to generate a phase-shifted version of the modulated signal based on the at least one combined modulated signal;

wherein the matching network circuitry is further configured to match an output impedance of the plurality of phase shifters to an input impedance of the quadrature hybrid.

6. The receiver of claim 5, wherein the at least one combined signal comprises a first combined signal and a second combined signal.

7. The receiver of claim 6, wherein the quadrature hybrid is further configured to:
- delay the second combined signal to generate a delayed, second combined signal; and
- combine the first combined signal with the delayed, second combined signal to generate the phase-shifted version of the modulated signal.

* * * * *